United States Patent
Hayashi et al.

(10) Patent No.: US 7,035,153 B2
(45) Date of Patent: Apr. 25, 2006

(54) SEMICONDUCTOR MEMORY DEVICE OF BIT LINE TWIST SYSTEM

(75) Inventors: Shintaro Hayashi, Yokohama (JP);
Manabu Satoh, Ashigarakami-gun (JP);
Masahiro Yoshihara, Yokohama (JP);
Naoaki Kanagawa, Yokohama (JP);
Mami Kawabata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/978,457

(22) Filed: Nov. 2, 2004

(65) Prior Publication Data

US 2005/0141297 A1    Jun. 30, 2005

(30) Foreign Application Priority Data

Dec. 25, 2003    (JP) .............................. 2003-431035

(51) Int. Cl.
*G11C 29/00*    (2006.01)
(52) U.S. Cl. .................... 365/200; 365/201; 714/48
(58) Field of Classification Search ................ 365/200, 365/201; 714/48
See application file for complete search history.

(56) References Cited

U.S. PATENT DOCUMENTS

| 2001/0046166 A1* | 11/2001 | Fischer et al. .............. 365/200 |
| 2003/0002361 A1* | 1/2003  | Fischer et al. .............. 365/200 |

FOREIGN PATENT DOCUMENTS

| JP | 62-51096  | 3/1987  |
| JP | 6-314498  | 11/1994 |

* cited by examiner

*Primary Examiner*—Anh Phung
*Assistant Examiner*—N Nguyen
(74) *Attorney, Agent, or Firm*—Oblon, Spivak, McClelland, Maier & Neustadt, P.C.

(57) ABSTRACT

A semiconductor memory device adopting a bit line twist system in which at least a part of bit lines are twisted, includes memory cell arrays each having a plurality of memory cells to store data, redundancy cell arrays each having a plurality of redundancy cells to replace a defective cell in the memory cell array, and a control circuit which performs control to invert a direction of the data. The device further includes an inversion circuit which inverts the direction of the data, in accordance with the control by the control circuit.

19 Claims, 18 Drawing Sheets

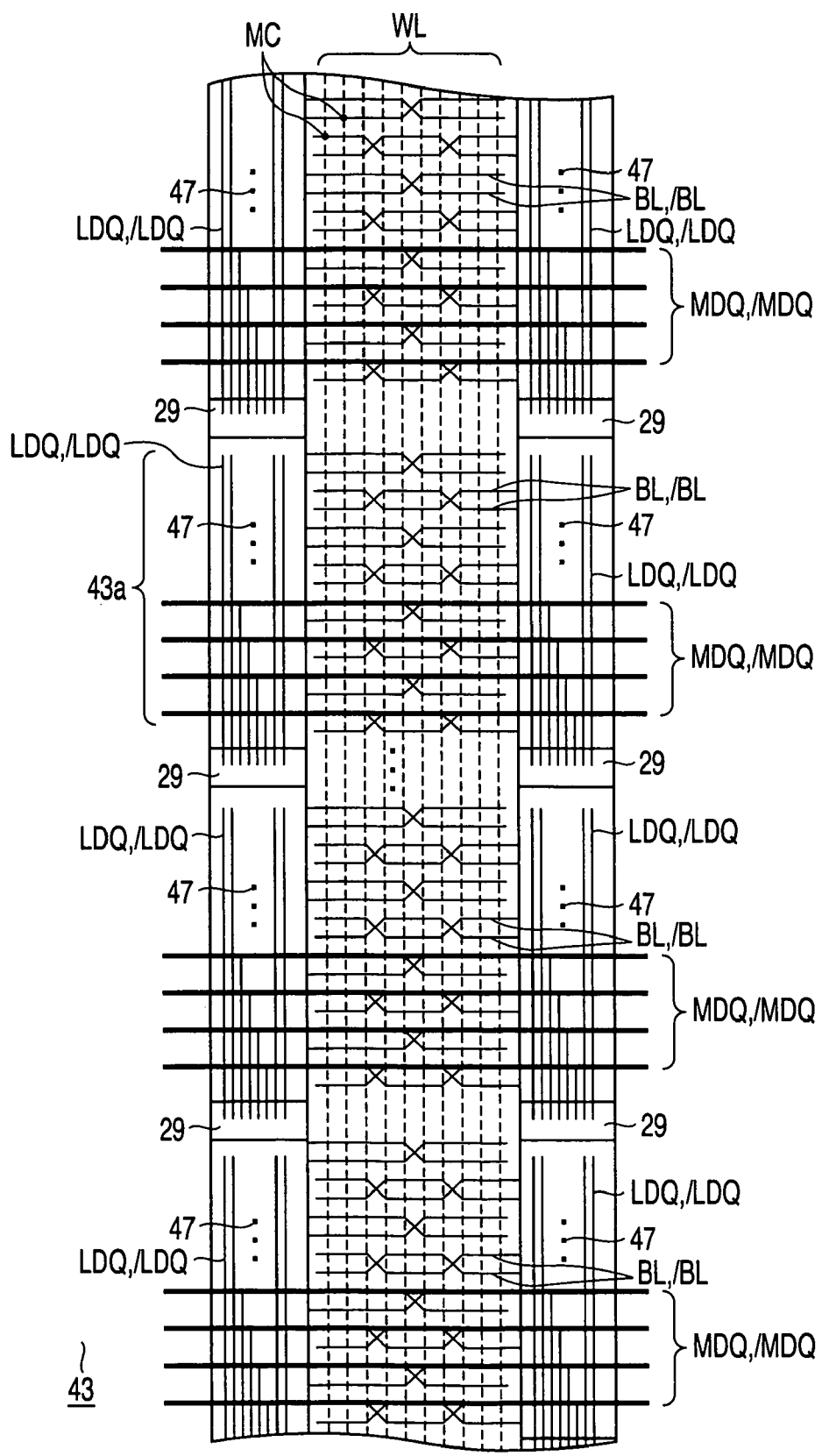
F I G. 2

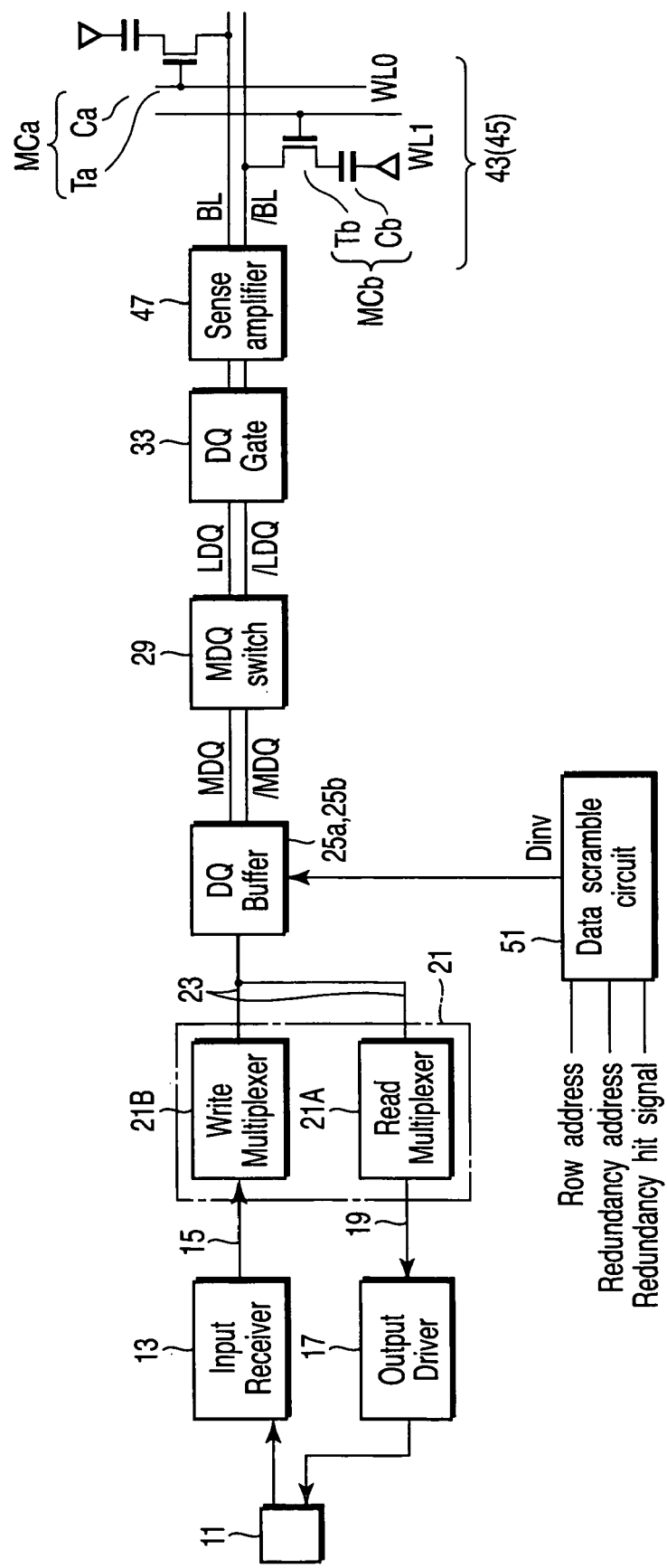
F I G. 3

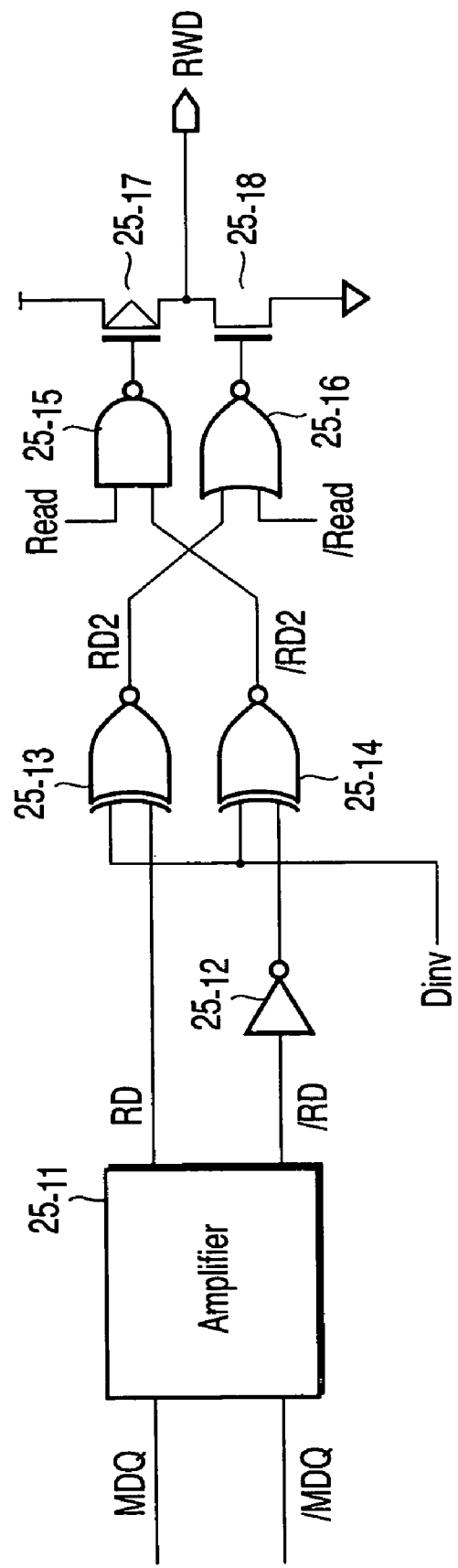
F I G. 5

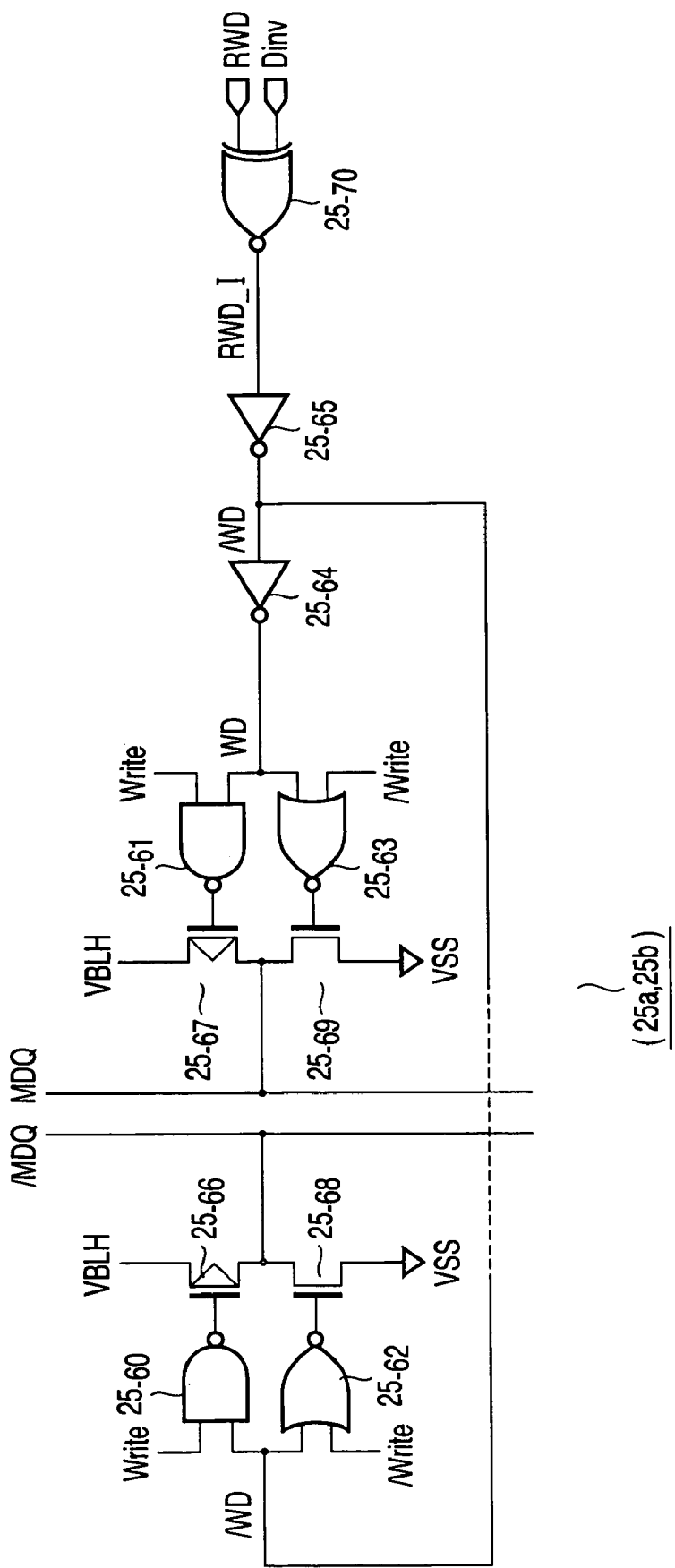
F I G. 8

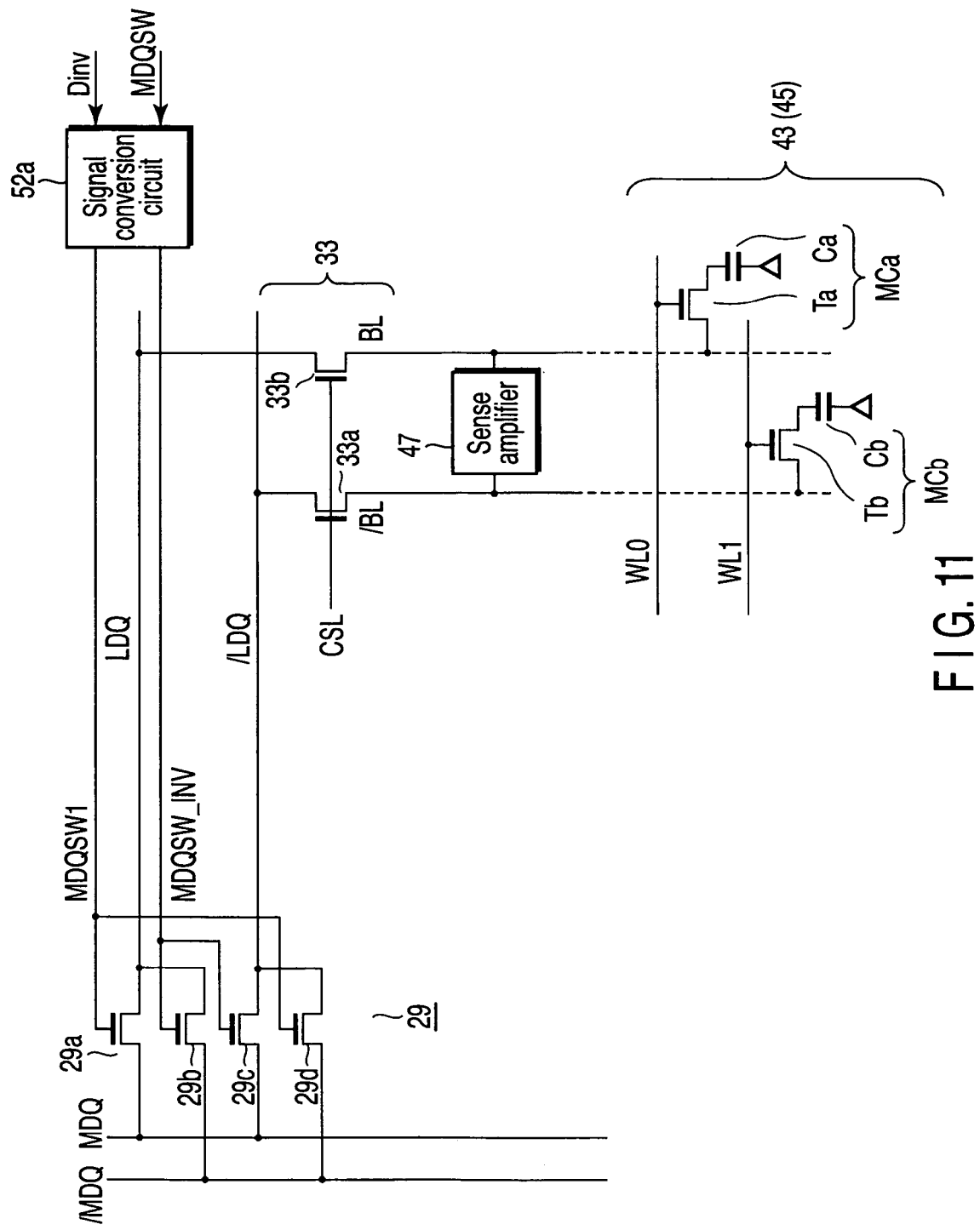
F I G. 11

SEMICONDUCTOR MEMORY DEVICE OF BIT LINE TWIST SYSTEM

CROSS-REFERENCE TO RELATED APPLICATIONS

This application is based upon and claims the benefit of priority from prior Japanese Patent Application No. 2003-431035, filed Dec. 25, 2003, the entire contents of which are incorporated herein by reference.

BACKGROUND OF THE INVENTION

1. Field of the Invention

This invention relates to a semiconductor memory device. More specifically, this invention relates to an on-chip scramble circuit for memory test (property evaluation), in the case where a defective cell in a regular cell array is replaced by a redundancy cell in a semiconductor memory device adopting a bit line twist system.

2. Description of the Related Art

As is well known, there has been proposed a semiconductor memory device adopting a bit line twist system, in which at least a part of a plurality of bit lines are twisted (for example, refer to Jpn. Pat. Appln. KOKAI Pub. No. 62-51096). Adopting the bit line twist system in a semiconductor memory device is very effective in reducing coupling noise from adjacent bit lines in operation of the bit line when data is read out from and written in a memory cell.

A problem of a semiconductor memory device caused by adopting the bit line twist system is consistency of redundancy cell data. Specifically, if the bit line twist system is adopted, the data direction (phase) of a redundancy cell connected to a word line in which a redundancy replacement has been performed changes according to the address of the word line for which redundancy is performed. This is because each redundancy cell is connected with one of complementary bit lines. Therefore, depending on the address of the word line, there are cases where the data direction of a redundancy cell which has performed redundancy replacement is reverse to the data direction of the regular cell (defective cell) which has been replaced. As described above, unless the address of the word line in which redundancy replacement is performed is restricted, the data direction of the redundancy cell cannot be conformed to the data direction of the defective cell.

As described above, as a measure against noise due to interference between adjacent bit lines, various bit line twist systems have been proposed. However, in a conventional semiconductor memory device adopting a bit line twist system, unless the address of the word line in which redundancy replacement is performed is restricted, it is difficult to conform the data direction of the redundancy cell which has performed redundancy replacement to the data direction of the defective cell which has been replaced. Therefore, in a memory test after a redundancy replacement, there is a problem that the redundancy cell which has replaced cannot be properly evaluated.

BRIEF SUMMARY OF THE INVENTION

According to a first aspect of the present invention, there is provided a semiconductor memory device adopting a bit line twist system in which at least a part of bit lines are twisted, the semiconductor memory device comprising: memory cell arrays each having a plurality of memory cells to store data; redundancy cell arrays each having a plurality of redundancy cells to replace a defective cell in the memory cell array; a control circuit which performs control to invert a direction of the data; and an inversion circuit which inverts the direction of the data, in accordance with the control by the control circuit.

BRIEF DESCRIPTION OF THE SEVERAL VIEWS OF THE DRAWING

FIG. 2 is a diagram illustrating a configuration example of a cell array portion of the semiconductor memory device shown in FIG. 1.

FIG. 3 is a block diagram illustrating a basic configuration of the semiconductor memory device shown in FIG. 1.

FIG. 5 is a circuit diagram illustrating another configuration example of the DQ buffer shown in FIG. 3.

FIG. 8 is a circuit diagram illustrating a configuration example of a DQ buffer in a semiconductor memory device adopting a bit line twist system according to a second embodiment of the present invention.

FIG. 11 is a circuit diagram illustrating a configuration example of the MDQ switch shown in FIG. 10.

DETAILED DESCRIPTION OF THE INVENTION

Embodiments of the present invention are explained with reference to drawings.

FIRST EMBODIMENT

Figure 1:
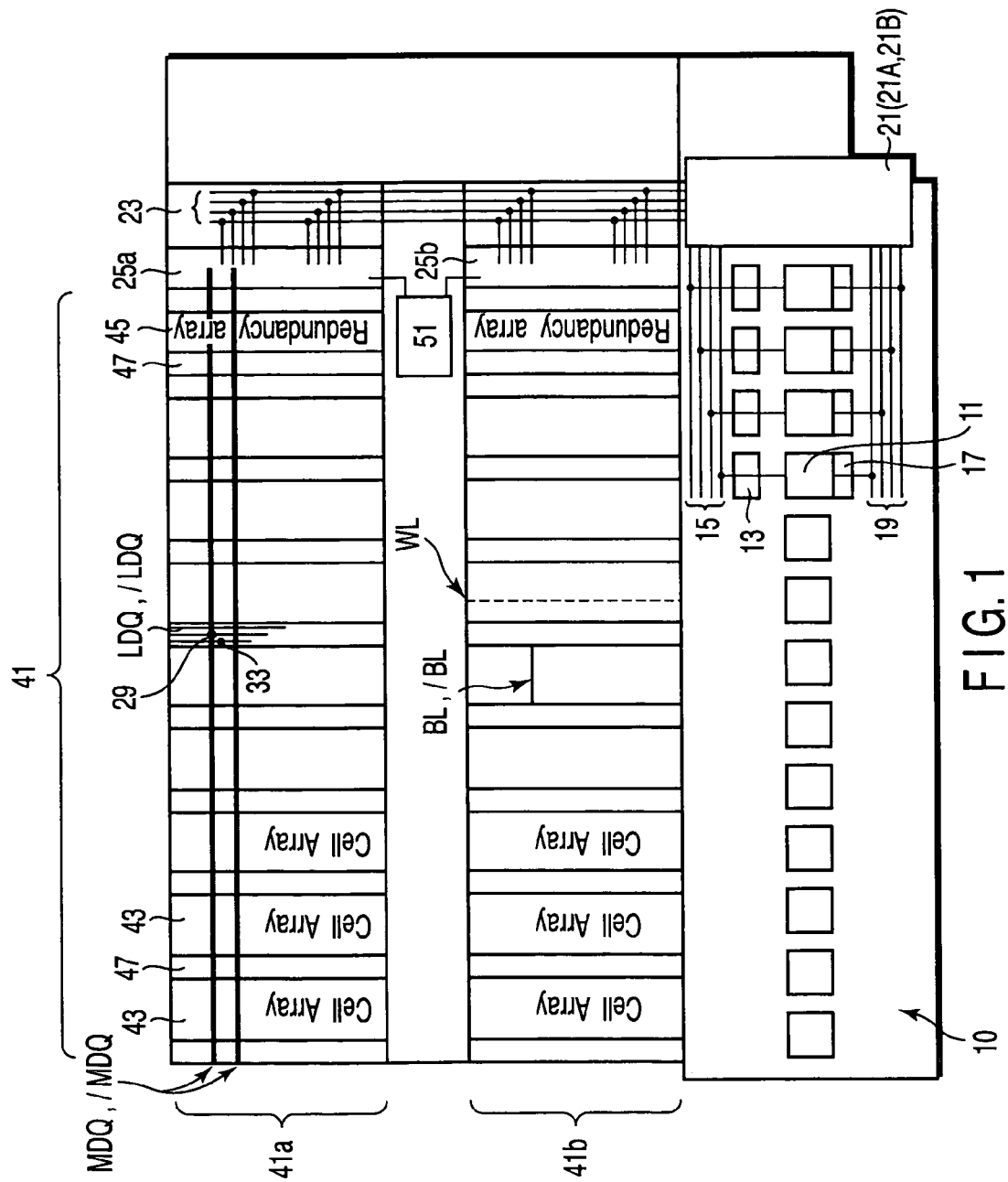
FIG. 1 is a diagram illustrating a configuration example of a semiconductor memory device adopting a bit line twist system according to a first embodiment of the present invention.

FIG. 1 illustrates a configuration example of a semiconductor memory device (memory chip) adopting a bit line twist system according to a first embodiment of the present invention. Specifically, a memory chip 10 is provided with a plurality of DQ pads 11. The DQ pads 11 are connected with a plurality of write data lines 15 via respective input receivers 13. Further, the DQ pads 11 are connected with a plurality of read data line 19 via respective output drivers 17. The plurality of write data lines 15 and the plurality of read data lines 19 are connected to a multiplexer (for example, a multi-bank multiplexing circuit) 21. The multiplexer 21 has a read multiplexer (Read MUX circuit) 21A for reading data, and a write multiplexer (Write MUX circuit) 21B for writing data.

The multiplexer 21 is connected with DQ buffers (inversion circuits) 25a and 25b via RWD (Read Write Data) lines 23. Each of the DQ buffers 25a and 25b is connected with a plurality of main DQ line pairs MDQ, /MDQ. Each of the DQ buffers 25a and 25b is connected with an output signal line of a data scramble circuit (control circuit) 51 described below. The main DQ line pairs MDQ, /MDQ are connected with respective local DQ line pairs LDQ, /LDQ via respective MDQ switches 29. The local DQ line pairs LDQ, /LDQ are arranged in a direction orthogonal to the main DQ line pairs MDQ, /MDQ. The local DQ line pairs LDQ, /LDQ are connected to respective DQ gates 33. The main DQ line pairs MDQ, /MDQ and the local DQ line pairs LDQ, /LDQ are arranged in an upper layer of a cell array region 41.

The cell array region 41 has, for example, a first and a second memory cell array portions 41a and 41b. Each of the first and second memory cell array portions 41a and 41b has a plurality of cell array (regular cell array) portions 43 and at least one redundancy cell array portion 45. A plurality of sense amplifier (S/A) 47 are arranged on each side of each of the plurality of the regular cell array portions 43 and said at least one redundancy cell array portion 45. The plurality of sense amplifiers 47 are connected with the respective DQ gates 33 and respective bit line pairs BL, /BL. Thereby, a defective cell (defective regular cell MC) in any of the regular cell array portions 43 can be replaced by row, for example, by a redundancy cell (RMC) of said at least one redundancy cell array portion 45.

Each of the plurality of regular cell array portions 43 has a plurality of memory cell arrays 43a, as shown in FIG. 2. In each of the memory cell arrays 43a, a regular cell MC (MCa, MCb, . . . ) being a memory cell is arranged in each of intersection points between bit line pairs BL, /BL adopting "three-time twist system" and word lines WL (WL0, WL1, . . . ). Each of the regular cells MC is formed of a cell transistor (Ta, Tb, . . . ) and a cell capacitor (Ca, Cb, . . . ).

In the above "three-time twist system", bit line pairs BL, /BL each of which is twisted once in a position of about ½ in the lateral direction of the memory cell array 43a, and bit line pairs BL, /BL each of which is twisted twice in positions of about ¼ and ¾ in the lateral direction of the memory cell array 43a are alternatively arranged. Further, the redundancy cell array portion is formed with almost the same configuration as that of the regular cell array portions 43.

FIG. 3 is a block diagram illustrating a basic structure of the above semiconductor memory device. Generally, data inputted from a DQ pad 11 is written in a regular cell MC (MCa, MCb, . . . ) designated by row and column addresses. In the meantime, data read out from a regular cell MC designated by row and column addresses is outputted to the outside through a DQ pad 11. Specifically, in the semiconductor memory device having the above structure, write operation is a series of operations for writing data inputted from the DQ pad 11 in a regular cell MC (or a corresponding redundancy cell) designated by row and column addresses. In the meantime, read operation is a series of operations for reading cell data of a regular cell MC (or a corresponding redundancy cell) designated by row and column addresses and outputting the data from the DQ pad 11.

In the write operation and the read operation, one word line WL (WL0, WL1, . . . ) is activated in accordance with a row address. Thereby, a desired regular cell MC (or a corresponding redundancy cell) is electrically connected to one bit line of the bit line pair BL, /BL. In this example, as the regular cell MC, there are the regular cell MCa (WL0) connected to the bit line BL, and the regular cell MCb (WL1) connected to the bit line /BL, depending on the address of the word line WL. In write operation, data of the same direction (phase) as that of the data inputted from the DQ pad 11 is written in the regular cell MCa which is connected to the bit line BL. In the meantime, data of the direction opposite to that of the data inputted from the DQ pad 11 is written in the regular cell MCb connected to the bit line /BL.

The data scramble circuit 51 is configured to receive a Row address, a redundancy address and a redundancy hit signal as inputs, and output (activate), for example, a data inversion control signal Dinv for inverting the direction of data written in a redundancy cell (RMC). The redundancy address is address information indicating which cell (RMC) in the redundancy cell array portion 45 has replaced the defective cell. Further, the redundancy hit signal is a signal which internally detects and activates an access to the cell (RMC) which has performed redundancy replacement.

In this embodiment, the data inversion control signal Dinv from the data scramble circuit 51 is supplied to the DQ buffers 25a and 25b. Specifically, the DQ buffers 25a and 25b which have received the data inversion control signal Dinv can invert the direction of the data written in the cell (RMC) which has performed redundancy replacement in read operation, for example. Thereby, it becomes possible to read data having a different direction from that of the data actually written therein from the cell (RMC) which has performed redundancy replacement. Therefore, in a memory test and the like, it is possible to always read out data having the same direction as that of the data of the replaced defective cell in the memory cell array 43a, regardless of the direction of the data written in the redundancy cell (RMC).

Figure 4:
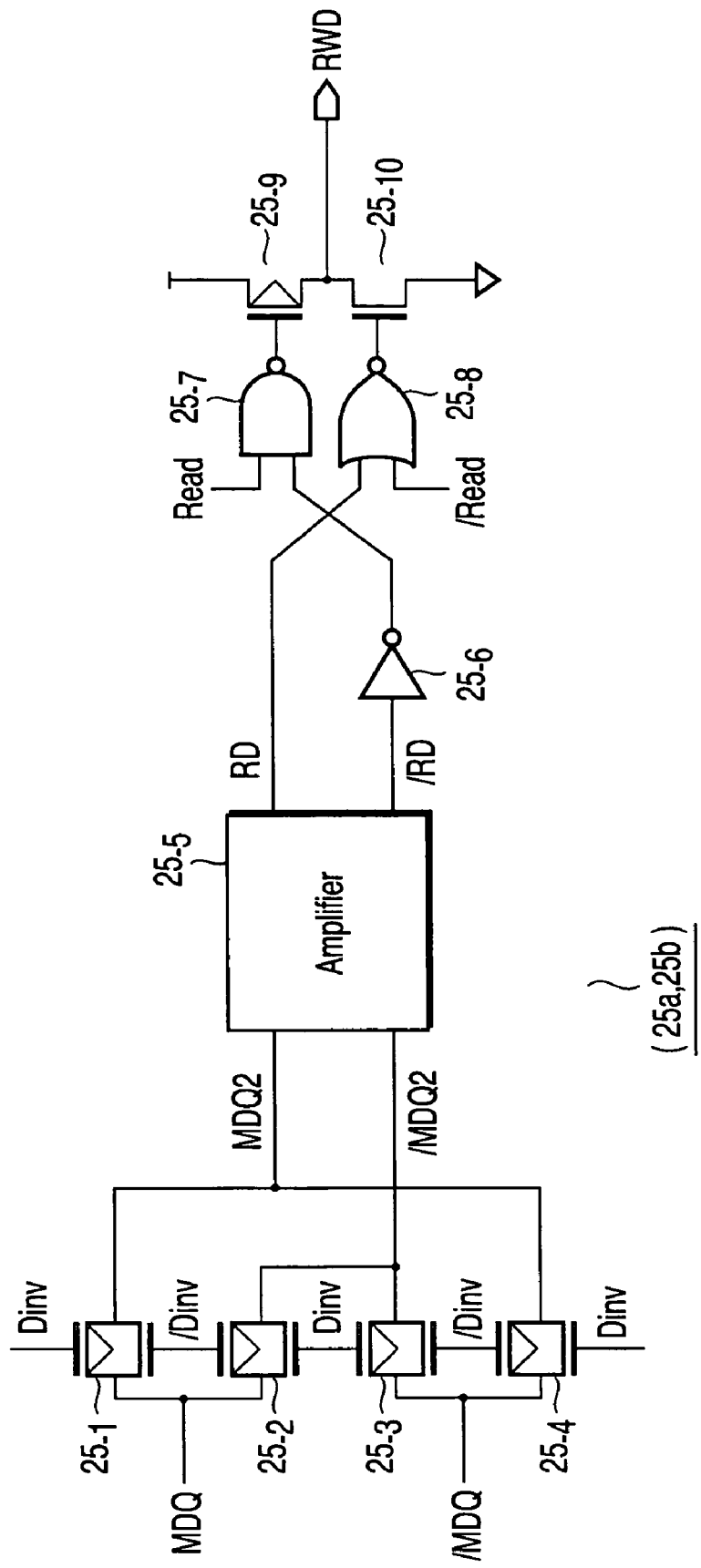
FIG. 4 is a circuit diagram illustrating a configuration example of the DQ buffer shown in FIG. 3.

FIG. 4 illustrates a circuit configuration example of the above DQ buffers 25a and 25b. In FIG. 4, only a read circuit in each of the DQ buffers 25a and 25b is shown. Specifically, each of the read circuits for the DQ buffers 25a and 25b comprises, for example, transfer gates $25_{-1}$, $25_{-2}$, $25_{-3}$, $25_{-4}$, an amplifier $25_{-5}$, an inverter circuit $25_{-6}$, a NAND circuit $25_{-7}$, a NOR circuit $25_{-8}$, a PMOS transistor $25_{-9}$, and an NMOS transistor $25_{-10}$.

In normal read operation (no data inversion is performed), a signal Read supplied to one input end of the NAND circuit $25_{-7}$ is "H (High)", and a signal /Read supplied to one input end of the NOR circuit $25_{-8}$ is "L (Low)". Further, the data inversion control signal Dinv from the data scramble circuit 51 is "L" (/Dinv="H"), and the transfer gates $25_{-1}$ and $25_{-3}$ become the ON state, and the transfer gates $25_{-2}$ and $25_{-4}$ become the OFF state. Thereby, data of the main DQ line pair MDQ, /MDQ is transferred as data MDQ2, /MDQ2, respectively, to the amplifier $25_{-5}$, through the transfer gates $25_{-1}$, $25_{-3}$.

One output (amplified signal RD of data MDQ2) of the amplifier $25_{-5}$ is supplied to the other input end of the NOR circuit $25_{-8}$. Further, the other output (amplified signal /RD of data /MDQ2) of the amplifier $25_{-5}$ is supplied to the other input end of the NAND circuit $25_{-7}$ via the inverter circuit $25_{-6}$. Thereby, the gate of the PMOS transistor $25_{-9}$ is controlled by the output of the NAND circuit $25_{-7}$ and the gate of the NMOS transistor $25_{-10}$ is controlled by the output of the NOR circuit $25_{-8}$. As a result, the data of the main DQ line MDQ is transferred to a RWD line 23 connected to an intermediate node which connects the PMOS transistor $25_{-9}$ and the NMOS transistor $25_{-10}$ in series.

In the meantime, if data inversion is performed in read operation, the data inversion control signal Dinv from the data scramble circuit 51 is "H" (/Dinv="L"), and the transfer gates $25_{-1}$ and $25_{-3}$ become the OFF state, and the transfer gates $25_{-2}$ and $25_{-4}$ become the ON state. Thereby, the data of the main DQ line MDQ is transferred as data /MDQ2, and the data of the main DQ line /MDQ is transferred as data MDQ2, to the amplifier $25_{-5}$. As a result, the data of the main DQ line /MDQ is transferred to the RWD line 23.

FIG. 5 illustrates another circuit configuration example of the above DQ buffers 25a and 25b. In FIG. 5, only a read circuit in each of the DQ buffers 25a and 25b is shown. Specifically, the read circuit has an amplifier $25_{-11}$, an inverter circuit $25_{-12}$, exclusive OR circuits $25_{-13}$ and $25_{-14}$, a NAND circuit $25_{-15}$, a NOR circuit $25_{-16}$, a PMOS transistor $25_{-17}$, and an NMOS transistor $25_{-18}$.

In such a configuration, in normal read operation (data inversion is not performed), a signal Read supplied to one input end of the NAND circuit $25_{-15}$ is "H (High)", and a signal /Read supplied to one input end of the NOR circuit $25_{-16}$ is "L (Low)". Further, the data inversion control signal Dinv from the data scramble circuit 51 is "L", and supplied to each one input end of the exclusive OR circuits $25_{-13}$ and $25_{-14}$. One output (amplified signal RD of the data MDQ) is supplied to the other input end of the exclusive OR circuit $25_{-13}$. The other output (amplified signal /RD of the data /MDQ) is supplied to the other input end of the exclusive OR circuit $25_{-14}$ via the inverter circuit $25_{-12}$. Thereby, data RD2, and /RD2 having the same phase as that of the amplified signal RD is outputted from the exclusive OR circuits $25_{-13}$ and $25_{-14}$, respectively.

The output RD2 of the exclusive OR circuit $25_{-13}$ is supplied to the other input end of the NOR circuit $25_{-16}$ which controls the gate of the NMOS transistor $25_{-18}$. Further, the output /RD2 of the exclusive OR circuit $25_{-14}$ is supplied to the other input end of the NAND circuit $25_{-15}$ which controls the gate of the PMOS transistor $25_{-17}$. As a result, the data of the main DQ line MDQ is transferred to a RWD line 23 connected to an intermediate node (junction point) between the PMOS transistor $25_{-17}$ and the NMOS transistor $25_{-18}$.

In the meantime, if data inversion is performed in read operation, the data inversion control signal Dinv from the data scramble circuit 51 is "H". Thereby, the outputs RD2, /RD2 of the exclusive OR circuits $25_{-13}$ and $25_{-14}$ have the same phase as that of the other output (amplified signal /RD of the data /MDQ) of the amplifier $25_{-11}$. Specifically, data (RD2, /RD2) having a phase opposite to that of the amplified signal RD is outputted from the exclusive OR circuits $25_{-13}$ and $25_{-14}$, respectively. As a result, the data of the main DQ line /MDQ having a phase opposite to that of the amplified signal RD is transferred to the RWD line 23.

Figure 6:
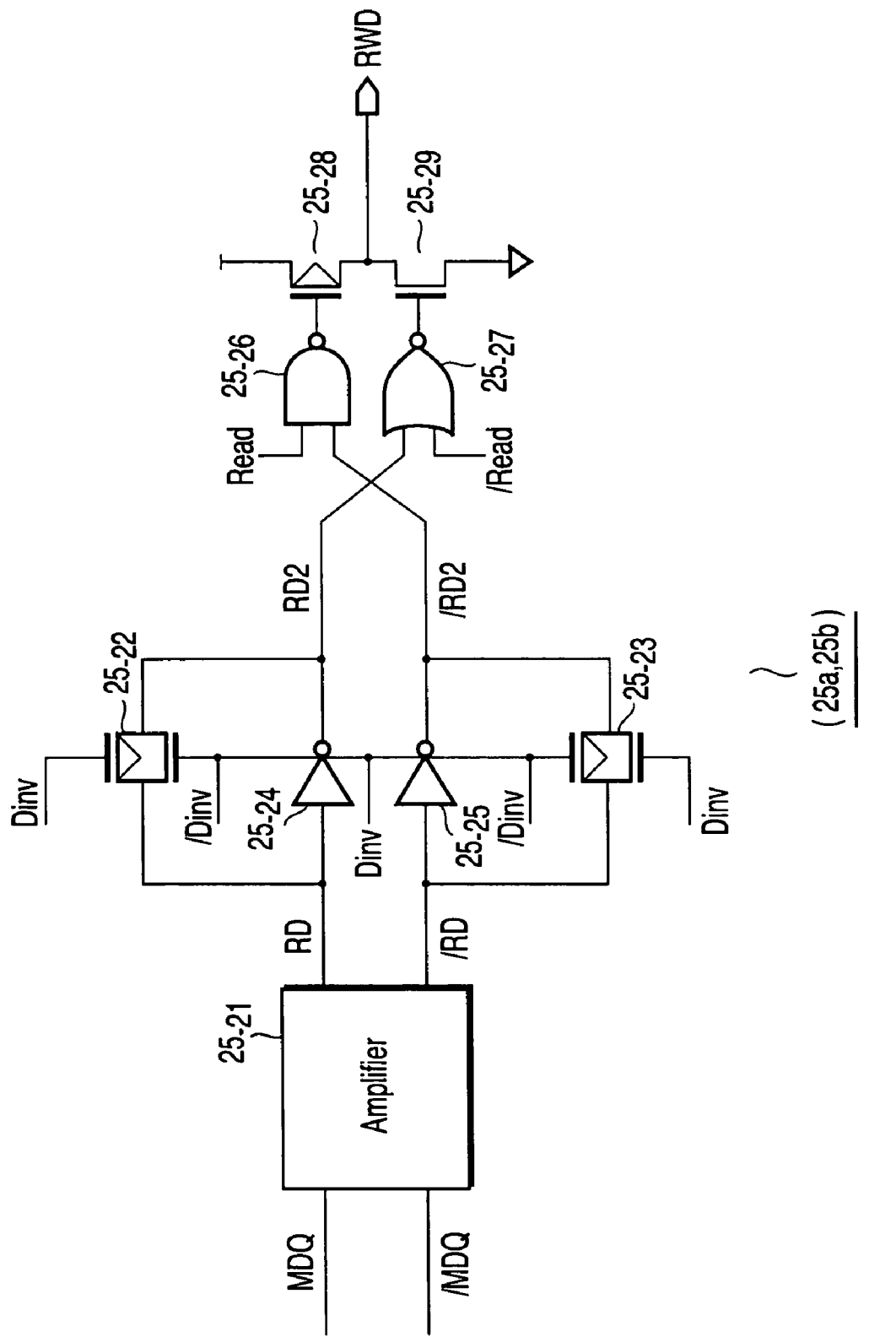
FIG. 6 is a circuit diagram illustrating further another configuration example of the DQ buffer shown in FIG. 3.

FIG. 6 illustrates another circuit configuration example of the DQ buffers 25a and 25b. FIG. 6 only shows a read circuit in each of the DQ buffers 25a and 25b. Specifically, the read circuit has an amplifier $25_{-21}$, transfer gates $25_{-22}$ and $25_{-23}$, clocked inverter circuits $25_{-24}$ and $25_{-25}$, a NAND circuit $25_{-26}$, a NOR circuit $25_{-27}$, a PMOS transistor $25_{-28}$, and an NMOS transistor $25_{-29}$.

In such a configuration, in normal read operation (data inversion is not performed), a signal Read supplied to one input end of the NAND circuit $25_{-26}$ is "H (High)", and a signal /Read supplied to one input end of the NOR circuit $25_{-27}$ is "L (Low)". Further, the data inversion control signal Dinv from the data scramble circuit 51 is "L" (/Dinv="H"), the transfer gate $25_{-22}$ and the clocked inverter circuit $25_{-25}$ become the ON state, and the transfer gate $25_{-23}$ and the clocked inverter circuit $25_{-24}$ become the OFF state. Thereby, both a signal RD2 which is supplied to the other input end of the NOR circuit $25_{-27}$ to control the gate of the NMOS transistor $25_{-29}$, and a signal /RD2 which is supplied to the other input end of the NAND circuit $25_{-26}$ to control the gate of the PMOS transistor $25_{-28}$ have the same phase as that of one output (amplified signal RD of the data MDQ) of the amplifier $25_{-21}$. As a result, the data of the main DQ line MDQ is transmitted to a RWD line 23 connected to an intermediate node (junction point) between the PMOS transistor $25_{-28}$ and the NMOS transistor $25_{-29}$.

In the meantime, if data inversion is performed in read operation, the data inversion control signal Dinv from the data scramble circuit 51 is "H" (/Dinv="L") Thereby, the transfer gate $25_{-23}$ and the clocked inverter circuit $25_{-24}$ become the ON state, and the transfer gate $25_{-22}$ and the clocked inverter circuit $25_{-25}$ become the OFF state. Specifically, both the signal RD2 which is supplied to the other input end of the NOR circuit $25_{-27}$ to control the gate of the NMOS transistor $25_{-29}$, and the signal /RD2 which is supplied to the other input end of the NAND circuit $25_{-26}$ to control the gate of the PMOS transistor $25_{-28}$ have the same phase as that of the other output (amplified signal /RD of the data /MDQ) of the amplifier $25_{-21}$. As a result, the data of the main DQ line /MDQ is transmitted to the RWD line 23 connected to the intermediate node (junction point) between the PMOS transistor $25_{-28}$ and the NMOS transistor $25_{-29}$.

Figure 7:
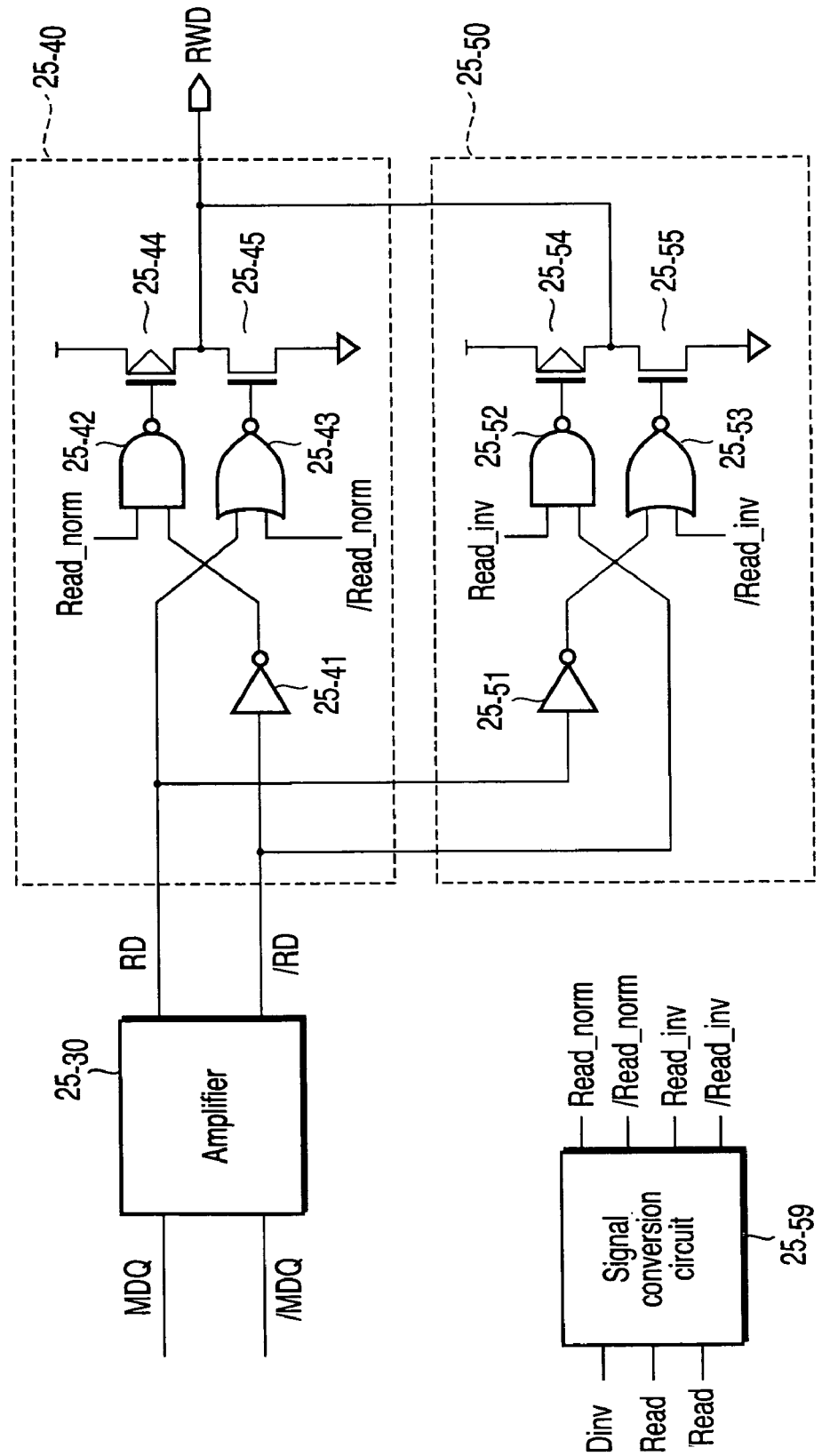
FIG. 7 is a circuit diagram illustrating further another configuration example of the DQ buffer shown in FIG. 3.

FIG. 7 illustrates another circuit configuration example of the above DQ buffers 25a and 25b. FIG. 7 only shows a read circuit in each of the DQ buffers 25a and 25b. Specifically, the read circuit has, for example, an amplifier $25_{-30}$, a first circuit $25_{-40}$, a second circuit $25_{-50}$, and a signal conversion circuit $25_{-59}$. The first circuit $25_{-40}$ operates in normal read operation, and has, for example, an inverter circuit $25_{-41}$, a NAND circuit $25_{-42}$, a NOR circuit $25_{-43}$, a PMOS transistor $25_{-44}$, and an NMOS transistor $25_{-45}$. The second circuit $25_{-50}$ operates in the case where data inversion is performed, and has, for example, an inverter circuit $25_{-51}$, a NAND circuit $25_{-52}$, a NOR circuit $25_{-53}$, a PMOS transistor $25_{-54}$, and an NMOS transistor $25_{-55}$.

If an input signal Read is "L (Low)" (/Read="H (High)"), the signal conversion circuit $25_{-59}$ sets output signals Read_norm and Read_inv to "L", and sets output signals /Read_norm and /Read_inv to "H", regardless of the state ("L" or "H") of the data inversion control signal Dinv from the data scramble circuit 51. In read operation, the input signal Read is "H" (/Read="L"). In the case where the input signal Read is "H", the states of the output signals change according to the signal state of the data inversion control signal Dinv. Specifically, in normal read operation (data inversion is not performed), the input signal Read is "H", and the data inversion control signal Dinv is "L". Thereby, the output signal Read_norm is "H", and the output signal /Read norm is "L", and the first circuit $25_{-40}$ becomes the ON state. Further, the output signal Read_inv is "L", and the output signal /Read_inv is "H", and the second circuit $25_{-50}$ becomes the OFF state.

In the meantime, if data inversion is performed in read operation, the data inversion control signal Dinv is "H". Thereby, the output signal Read_norm is "L", and the output signal /Read norm is "H", and the first circuit $25_{-40}$ becomes the OFF state. Further, the output signal Read_inv is "H" and the output signal /Read_inv is "L", and the second circuit $25_{-50}$ becomes the ON state.

The signal conversion circuit $25_{-59}$ executes the above signal conversion operations.

In the case of adopting the above configuration, in normal read operation (data inversion is not performed), the data inversion control signal Dinv from the data scramble circuit 51 to be inputted in the signal conversion circuit $25_{-59}$ is "L". Thereby, in the first circuit $25_{-40}$, the signal Read_norm supplied to one input end of the NAND circuit $25_{-42}$ is "H", and the signal /Read_norm supplied to one input end of the NOR circuit $25_{-43}$ is "L". Further, in the second circuit $25_{-50}$, the signal Read_inv supplied to one input end of the NAND circuit $25_{-52}$ is "L", and the signal /Read_inv supplied to one input end of the NOR circuit $25_{-53}$ is "H". As a result, the first circuit $25_{-40}$ becomes the ON state, and the second circuit $25_{-50}$ becomes the OFF state.

In the first circuit $25_{-40}$, one output (amplified signal RD of the data MDQ) of the amplifier $25_{-30}$ is supplied to the other input end of the NOR circuit $25_{-43}$ to control the gate of the NMOS transistor $25_{-45}$. Further, a signal obtained by inverting the other output (amplified signal /RD of the data /MDQ) by the inverter circuit $25_{-41}$ is supplied to the other input end of the NAND circuit $25_{-42}$ to control the gate of the PMOS transistor $25_{-44}$. As a result, the data of the main DQ line MDQ is transferred to a RWD line 23 connected to an intermediate node (junction point) between the PMOS transistor $25_{-44}$ and the NMOS transistor $25_{-45}$. In this case, the data of the main DQ line MDQ has the same phase as those of said one output (RD) of the amplifier $25_{-30}$ and the data outputted to the RWD line 23.

In the meantime, if data inversion is performed in read operation, the data inversion control signal Dinv to be inputted in the signal conversion circuit $25_{-59}$ from the data scramble circuit 51 is "H". Thereby, in the first circuit $25_{-40}$, the signal Read_norm supplied to said one input end of the NAND circuit $25_{-42}$ is "L", and the signal /Read_norm supplied to said one input end of the NOR circuit $25_{-43}$ is "H". Further, in the second circuit $25_{-50}$, the signal Read_inv supplied to said one input end of the NAND circuit $25_{-52}$ is "H", and the signal /Read_inv supplied to said one input end of the NOR circuit $25_{-53}$ is "L". As a result, the first circuit $25_{-40}$ becomes the OFF state, and the second circuit $25_{-50}$ becomes the ON state.

In the second circuit $25_{-50}$, said one output (RD) of the amplifier $25_{-30}$ is supplied, via the inverter circuit $25_{-51}$, to the other input end of the NOR circuit $25_{-53}$ to control the gate of the NMOS transistor $25_{-55}$. Further, the other output (/RD) of the amplifier $25_{-30}$ is supplied to the other input end of the NAND circuit $25_{-52}$ to control the gate of the PMOS transistor $25_{-54}$. As a result, the data of the main DQ line /MDQ is transmitted to the RWD line 23 connected to an intermediate node (junction point) between the PMOS transistor $25_{-54}$ and the NMOS transistor $25_{-55}$. In this case, the data outputted to the RWD line 23 is an inverted signal of the data of the main DQ line MDQ and said one output (RD) of the amplifier $25_{-30}$.

As described above, by using the read circuits of the DQ buffers 25a and 25b, it is possible to perform data inversion control in read operation, that is, to invert the direction (phase) of data read out of a cell in read operation and output the inverted data.

In the above DQ buffers 25a and 25b, it is also possible to perform data inversion control in write operation, that is, to perform control to invert the direction of data inputted from the DQ pad in write operation and write the inverted data in a cell.

Second Embodiment

FIG. 8 illustrates a circuit configuration example of DQ buffers (inversion circuit) according to a second embodiment of the present invention. In this embodiment, only a write circuit in each of DQ buffers 25a and 25b are shown. In this embodiment, the basic configuration of the semiconductor memory device (memory chip) is the same as that shown in FIG. 3. However, the data inversion control signal Dinv of the data scramble circuit 51 is a signal for performing inversion control of the direction of data to be written in a cell.

Specifically, the write circuit in each of the DQ buffers 25a and 25b has, for example, NAND circuits $25_{-60}$ and $25_{-61}$, NOR circuits $25_{-62}$, $25_{-63}$, inverter circuits $25_{-64}$, $25_{-65}$, PMOS transistors $25_{-66}$, $25_{-67}$, NMOS transistors $25_{-68}$, $25_{-69}$, and an exclusive OR circuit $25_{-70}$. A signal VBLH shown in FIG. 8 is a high potential of a main DQ line pair MDQ, /MDQ.

In normal write operation (no data inversion is performed), a signal Write supplied to one input end of each of the NAND circuits $25_{-60}$, $25_{-61}$ is "H (High)", and a signal /Write supplied to one input end of each of the NOR circuits $25_{-62}$, $25_{-63}$ is "L (Low)". Further, the data inversion control signal Dinv from the data scramble circuit 51 is "L", and supplied to one input end of the exclusive OR circuit $25_{-70}$. Data of the RWD line 23 is supplied to the other input end of the exclusive OR circuit $25_{-70}$. Thereby, data RWD_I having the same phase as that of the data of the RWD line 23 is outputted from the exclusive OR circuit $25_{-70}$.

The output (RWD_I) of the exclusive OR circuit $25_{-70}$ is inverted by the inverter circuit $25_{-65}$ into a signal /WD, and thereafter is supplied to the inverter circuit $25_{-64}$. The signal /WD outputted from the inverter circuit $25_{-65}$ is further inverted by the inverter circuit $25_{-64}$ into a signal WD. The signal WD is supplied to the other input end of the NAND circuit $25_{-61}$ for controlling the gate of the PMOS transistor $25_{-67}$, and the other input end of the NOR circuit $25_{-63}$ for controlling the gate of the NMOS transistor $25_{-69}$. Further, the signal /WD is supplied to the other input end of the NAND circuit $25_{-60}$ for controlling the gate of the PMOS transistor $25_{-66}$ and the other input end of the NOR circuit $25_{-62}$ for controlling the gate of the NMOS transistor $25_{-68}$. In this case, the data of the RWD line 23 has the same phase as that of the data being the output (RWD_I) of the exclusive OR circuit $25_{-70}$. As a result, the data of the RWD line 23 is transmitted to the main DQ line MDQ connected to an intermediate node (junction point) between the PMOS transistor 25$_{-67}$ and the NMOS transistor 25$_{-69}$. Further, the data (inverted data) having the phase opposite to that of the data of the RWD line 23 is transmitted to the main DQ line /MDQ connected to an intermediate node (junction) between the PMOS transistor 25$_{-66}$ and the NMOS transistor 25$_{-68}$.

In the meantime, if data inversion is performed in write operation, the data inversion control signal Dinv from the data scramble circuit 51 is "H". Thereby, the output RWD_I of the exclusive OR circuit 25$_{-70}$ is data (inverted data) having a phase opposite to that of the data of the RWD line 23. As a result, the data having a phase opposite to that of the data of the RWD line 23 is transmitted to the main DQ line MDQ, and the data having the same phase as that of the data of the RWD line 23 is transmitted to the main DR line /MDQ.

Figure 9:
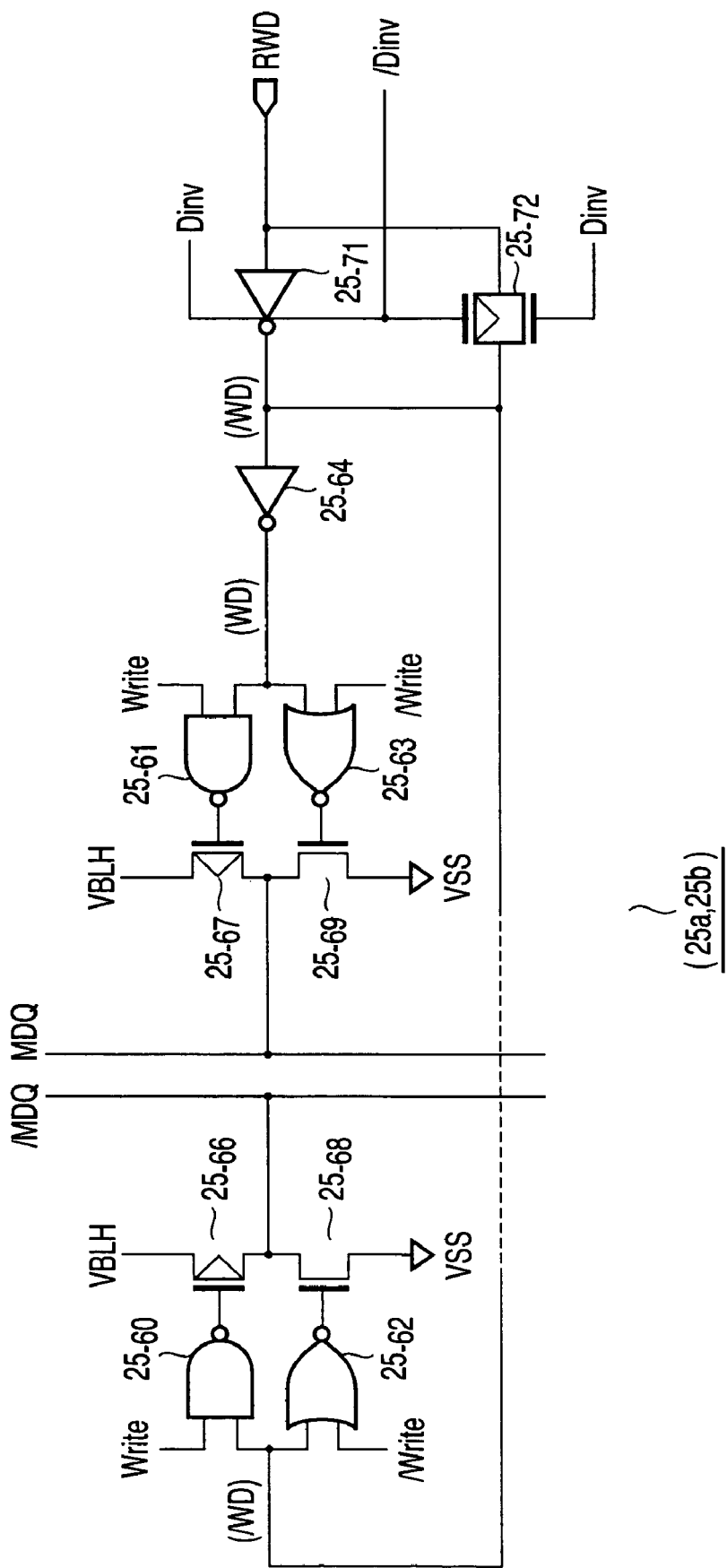
FIG. 9 is a circuit diagram illustrating another configuration example of the DQ buffer in the semiconductor memory device adopting the bit line twist system according to the second embodiment of the present invention.

FIG. 9 illustrates another circuit configuration example of the above DQ buffers 25a and 25b. FIG. 9 only shows a write circuit in each of the DQ buffers 25a and 25b. Specifically, the write circuit has NAND circuits 25$_{-60}$, 25$_{-61}$, NOR circuits 25$_{-62}$, 25$_{-63}$, an inverter circuit 25$_{-64}$, PMOS transistors 25$_{-66}$, 25$_{-67}$, NMOS transistors 25$_{-68}$, 25$_{-69}$, a clocked inverter circuit 25$_{-71}$, and a transfer gate 25$_{-72}$. A signal VBLH shown in FIG. 9 has a high potential of a main DQ line pair MDQ, /MDQ.

In such a configuration, in normal write operation (data inversion is not performed), a signal Write supplied to one input end of each of the NAND circuits 25$_{-60}$, 25$_{-61}$ is "H (High)", and a signal Write supplied to one end of each of the NOR circuits 25$_{-62}$ and 25$_{-63}$ is "L (Low)". Further, the data inversion control signal Dinv from the data scramble circuit 51 is "L" (/Dinv="H"), and the clocked inverter circuit 25$_{-71}$ becomes the ON state, and the transfer gate 25$_{-72}$ becomes the OFF state. Further, data of the RWD line 23 is supplied to an input end of the clocked inverter circuit 25$_{-71}$. Thereby, a signal /WD having a phase opposite to that of the data of the RWD line 23 is outputted from the clocked inverter circuit 25$_{-71}$.

The output (/WD) of the clocked inverter circuit 25$_{-71}$ is further inverted by the inverter circuit 25$_{-64}$ into signal WD. Thereafter, the signal WD is supplied to the other input end of the NAND circuit 25$_{-61}$ for controlling the gate of the PMOS transistor 25$_{-67}$, and the other input end of the NOR circuit 25$_{-63}$ for controlling the gate of the NMOS transistor 25$_{-69}$. Further, the signal /WD is supplied to the other end of the NAND circuit 25$_{-60}$ for controlling the gate of the PMOS transistor 25$_{-66}$, and the other input end of the NOR circuit 25$_{-62}$ for controlling the gate of the NMOS transistor 25$_{-68}$. In this case, the data of the RWD line 23 has a phase opposite to that of the output (/WD) of the clocked inverter circuit 25$_{-71}$. As a result, the data of the RWD line 23 is transmitted to the main DQ line MDQ connected to the intermediate node (junction point) between the PMOS transistor 25$_{-67}$ and the NMOS transistor 25$_{-69}$. Further, the data (inverted data) having a phase opposite to that of the data of the RWD line 23 is transmitted to the main DQ line /MDQ connected to the intermediate node (junction point) between the PMOS transistor 25$_{-66}$ and the NMOS transistor 25$_{-68}$.

In the meantime, if data inversion is performed in write operation, the data inversion control signal Dinv from the data scramble circuit 51 is "H" (/Dinv="L"). Thereby, the clocked inverter circuit 25$_{-71}$ becomes the OFF state, and the transfer gate 25$_{-72}$ becomes the ON state. As a result, data having a phase opposite to that of the data of the RWD line 23 is transmitted to the main DQ line MDQ, and data having the same phase as that of the data of the RWD line 23 is transmitted to the main DQ line /MDQ.

As described above, the write circuits of the DQ buffers 25a and 25b enable data inversion control in write operation, that is, inversion of the direction (phase) of the data written in a cell in write operation.

Third Embodiment

Figure 10:
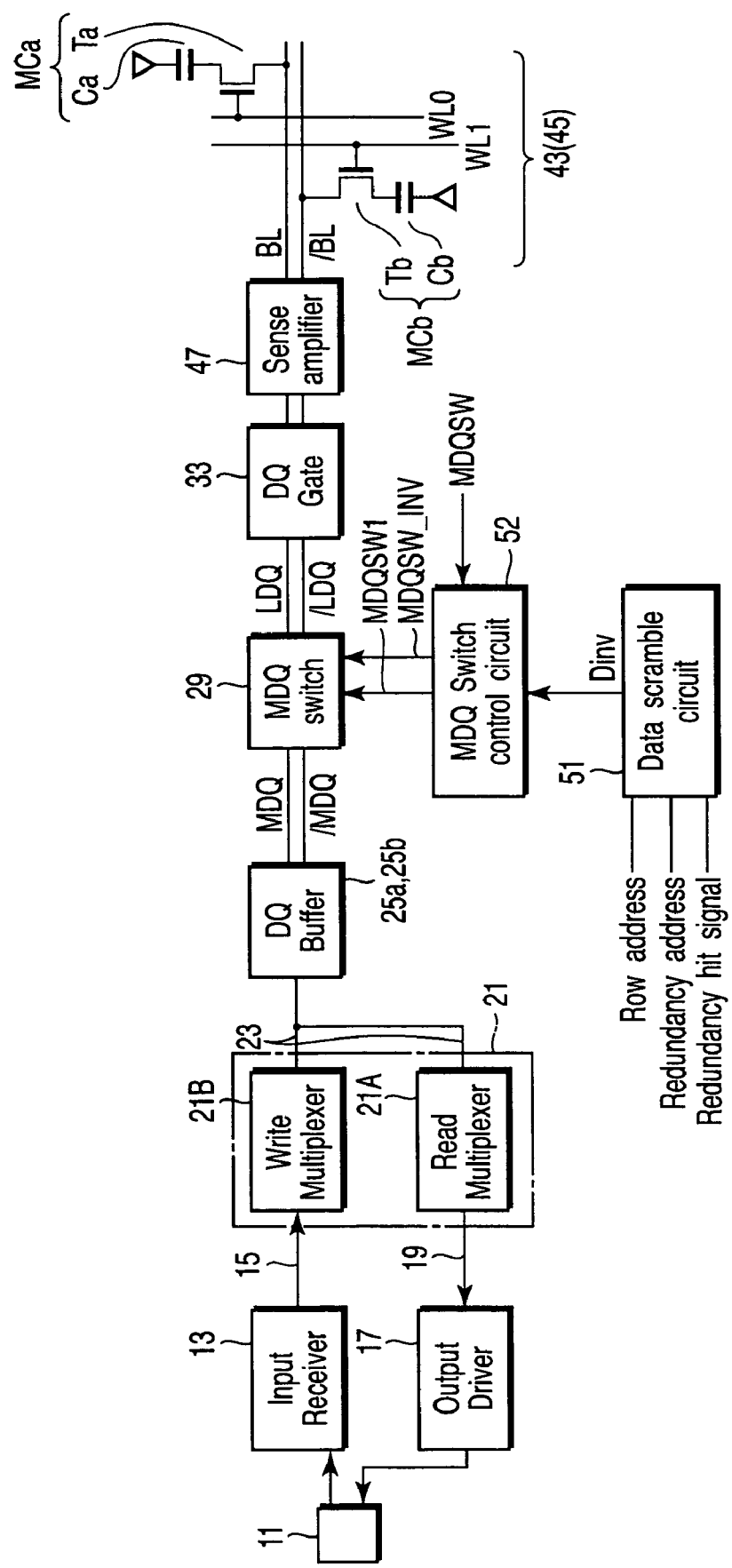
FIG. 10 is a block diagram illustrating a basic configuration of a semiconductor memory device adopting a bit line twist system according to a third embodiment of the present invention.

FIG. 10 is a block diagram of a basic configuration of a semiconductor memory device (memory chip) adopting a bit line twist system according to a third embodiment of the present invention. In this embodiment, explained is the configuration wherein the data inversion control signal Dinv from the data scramble circuit 51 is supplied to the MDQ switch control circuit 52. Specifically, this embodiment shows an example where an MDQ switch 29 which electrically connects the main DQ line pair MDQ and /MDQ and the local DQ line pair LDQ and /LDQ enables a series of data inversion control.

FIG. 11 illustrates a circuit configuration example of the MDQ switch (inversion circuit) 29. In this embodiment, the MDQ switch 29 has, for example, four NMOS transistors 29a, 29b, 29c and 29d. Specifically, the main DQ line MDQ is connected with a local DQ line LDQ with the NMOS transistor 29a interposed therebetween, and a local DQ line /LDQ with the NMOS transistor 29c interposed therebetween. Further, the main DQ line /MDQ is connected with the local DQ line LDQ with the NMOS transistor 29b interposed therebetween, and the local DQ line /LDQ with the NMOS transistor 29d interposed therebetween. A MDQ switch 29 having the above structure is provided for each ROW address.

Each gate of the NMOS transistors 29a, 29b, 29c, and 29d are controlled by output signals MDQSW1 and MDQSW_INV of a signal conversion circuit 52a. The output signals MDQSW1 and MDQSW_INV are obtained by inputting the data inversion control signal Dinv from the data scramble circuit 51 and a MDQ switch control signal MDQSW. The signal conversion circuit 52a is provided in the MDQ switch control circuit 52. If the MDQ switch control signal MDQSW is "L (Low)", both the output signals MDQSW1 and MDQSW_INV from the signal conversion circuit 52a are "L", regardless of the signal state of the data inversion control signal Dinv. If the MDQ switch control signal MDQSW is "H (High)", when the data inversion control signal Dinv is "L", the output signal MDQSW1 from the signal conversion circuit 52a is "H", and the output signal MDQSW_INV is "L". Further, in this case, when the data inversion control signal Dinv is "H", the output signal MDQSW1 from the signal conversion circuit 52a is "L", and the output signal MDQSW_INV is "H".

For example, in normal read operation and normal write operation, when a Row address is selected and a sense amplifier 47 corresponding to the selected Row address is activated, the MDQ switch control signal MDQSW is "H", and the data inversion control signal Dinv is "L". In this case, the output signal MDQSW1 from the signal conversion circuit 52a is "H", and the output signal MDQSW_INV is "L". Thereby, the main DQ line MDQ and the local DQ line LDQ corresponding to the Row address are electrically connected with the NMOS transistor 29a interposed therebetween, and the main DQ line /MDQ and the local DQ line /LDQ corresponding to the Row address are electrically connected with the NMOS transistor 29d interposed therebetween. Then, when a column selection line CSL is selected (CSL="H"), NMOS transistors 33a and 33b of a DQ gate 33 are turned on. Thereby, the local DQ line pair LDQ, /LDQ and a bit line pair BL, /BL are electrically connected. Specifically, the main DQ line pair MDQ, /MDQ and the bit line pair BL, /BL are electrically connected through the local DQ line pair LDQ, /LDQ.

In comparison with this, in the cases other than normal read operation and normal write operation, for example, if data inversion is performed in read operation and write operation, the MDQ switch control signal MDQSW is "H", and the data inversion control signal Dinv is "H". In this case, the output signal MDQSW1 from the signal conversion circuit 52a is "L", and the output signal MDQSW_INV is "H". Thereby, the main DQ line /MDQ and the local DQ line LDQ corresponding to the Row address are electrically connected with the NMOS transistor 29b interposed therebetween, and the main DQ line MDQ and the local DQ line /LDQ corresponding to the Row address are electrically connected with the NMOS transistor 29c interposed therebetween. Specifically, by selecting the column selection line CSL, the main DQ line /MDQ and the bit line BL are electrically connected through the local DQ line LDQ, and the main DQ line MDQ and the bit line /BL are electrically connected through the local DQ line /LDQ.

As described above, if data inversion is performed in read operation and write operation, the data inversion control signal Dinv from the data scramble circuit 51 becomes "H". Thereby, a regular cell MCb connected to the bit line /BL can be electrically connected to the main DQ line MDQ. Further, a regular cell MCa connected to the bit line BL can be electrically connected to the main DQ line /MDQ. As a result, according to activation of the word line WL1, that is, it becomes possible to invert the direction (phase) of data to be written in the cell MCb in write operation, and invert the direction (phase) of data to be read out from the cell MCb in read operation, that is, data inversion control in read operation.

Fourth Embodiment

Figure 12:
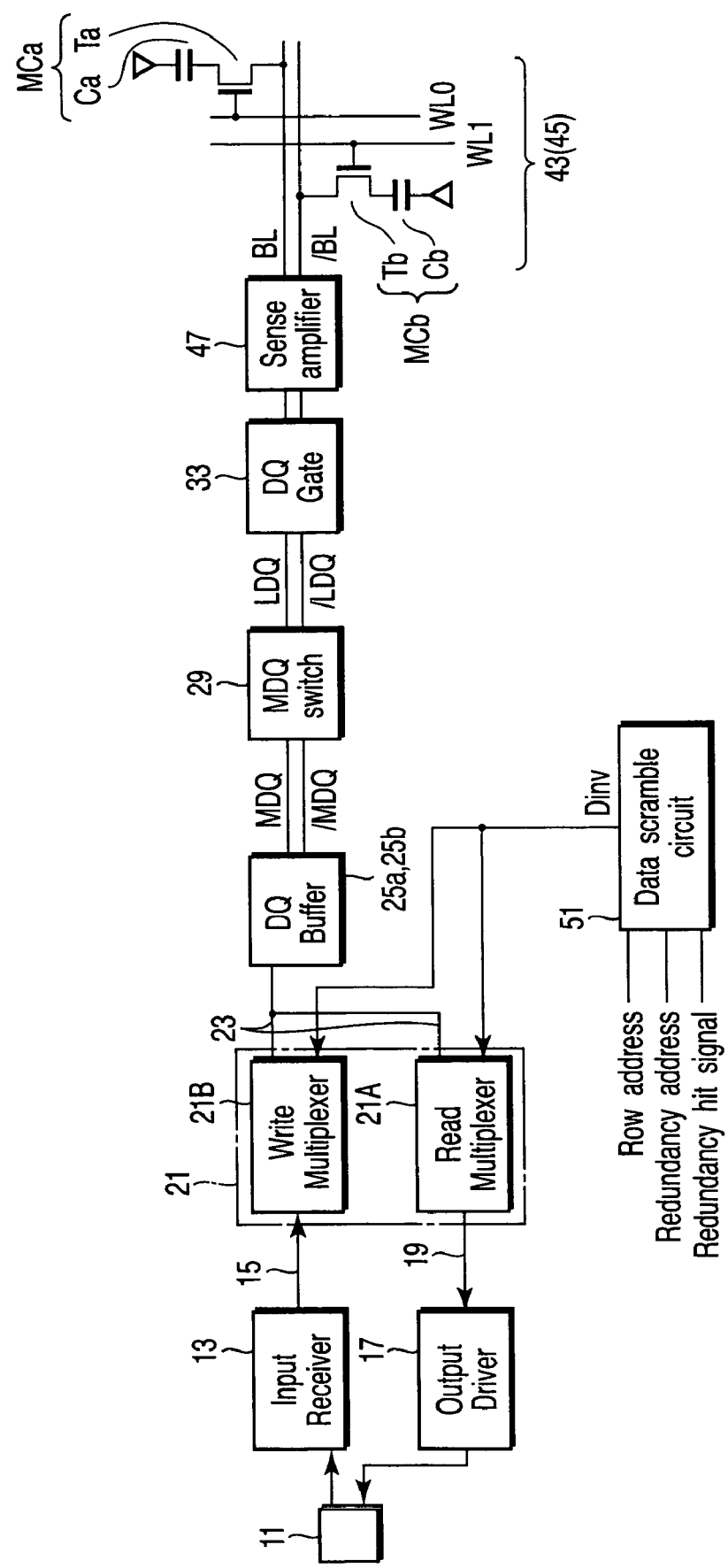
FIG. 12 is a block diagram illustrating a basic configuration of a semiconductor memory device adopting a bit line twist system according to a fourth embodiment of the present invention.

FIG. 12 is a block diagram of a basic configuration of a semiconductor memory device (memory chip) adopting a bit line twist method according to a fourth embodiment of the present invention. In this embodiment, explained is the case where the data inversion control signal Dinv from the data scramble circuit 51 is supplied to a multiplexer 21. Specifically, a read multiplexer 21A for data reading and write multiplexer 21B for data writing enable a series of data inversion control.

Figure 13:
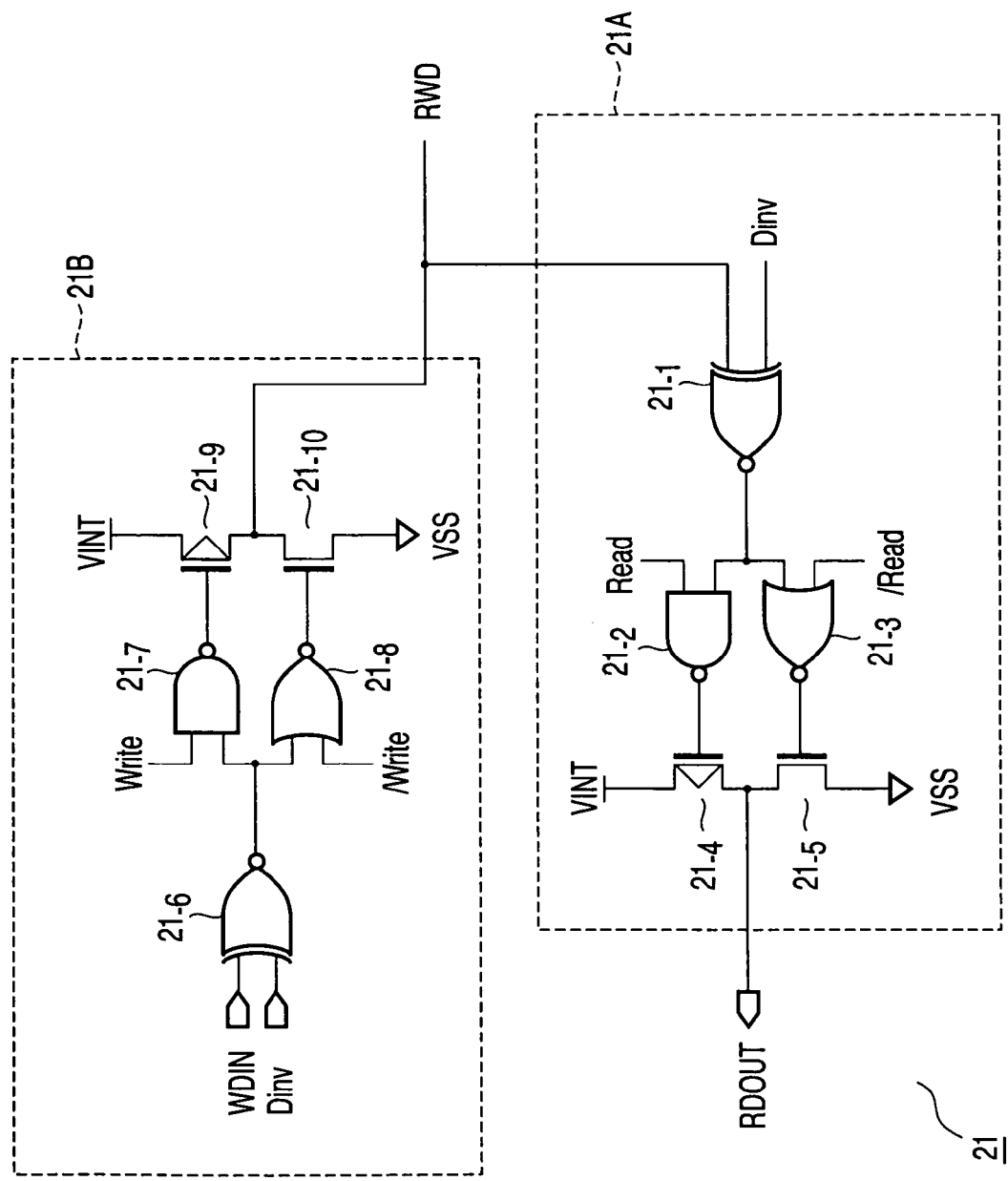
FIG. 13 is a circuit diagram illustrating a configuration example of the multiplexer shown in FIG. 12.

FIG. 13 illustrates an example of circuit configuration of the read multiplexer 21A and the write multiplexer 21B. In this embodiment, the read multiplexer 21A has, for example, an exclusive OR circuit $21_{-1}$, a NAND circuit $21_{-2}$, a NOR circuit $21_{-3}$, a PMOS transistor $21_{-4}$, and an NMOS transistor $21_{-5}$. The write multiplexer 21B has, for example, an exclusive OR circuit $21_{-6}$, a NAND circuit $21_{-7}$, a NOR circuit $21_{-8}$, a PMOS transistor $21_{-9}$, and an NMOS transistor $21_{-10}$.

In normal read operation (data conversion is not performed), a signal Read supplied to one input end of the NAND circuit $21_{-2}$ is "H (High)", and a signal /Read supplied to one input end of the NOR circuit $21_{-3}$ is "L (Low)". Further, the data inversion control signal Dinv from the data scramble circuit 51 is "L", and supplied to one input end of the exclusive OR circuit $21_{-1}$. Further, output of the DQ buffers 25a and 25b (data of the RWD line 23) is inputted to the other input end of the exclusive OR circuit $21_{-1}$. Thereby, data having the same phase as that of the data of the RWD line 23 is supplied from the exclusive OR circuit $21_{-1}$ to the other input end of the NAND circuit $21_{-2}$ and the other input end of the NOR circuit $21_{-3}$.

Specifically, the output of the exclusive OR circuit $21_{-1}$ is supplied to the other input end of the NAND circuit $21_{-2}$ for controlling the gate of the PMOS transistor $21_{-4}$. Further, the output of the exclusive OR circuit $21_{-1}$ is supplied to the other input end of the NOR circuit $21_{-3}$ for controlling the gate of the NMOS transistor $21_{-5}$. As a result, data (RDOUT) having the same phase as that of the data of the RWD line 23 is outputted onto the read data line 19 from an intermediate node (junction point) between the PMOS transistor $21_{-4}$ and the NMOS transistor $21_{-5}$, which are connected in series between a power supply node VINT and a ground node VSS.

In the meantime, if data inversion is performed in read operation, the data inversion control signal Dinv from the data scramble circuit 51 is "H". Thereby, the output of the exclusive OR circuit $21_{-1}$ has the phase opposite to that of the output of the DQ buffers 25a and 25b (data of the RWD line 23). Specifically, the exclusive OR circuit $21_{-1}$ outputs data having the phase opposite to that of the RWD line 23. As a result, data (RDOUT) having the phase opposite to that of the data of the RWD line 23 is outputted to the read data line 19.

Further, in normal write operation (data conversion is not performed), a signal Write supplied to one input end of the NAND circuit $21_{-7}$ is "H (High)", and a signal /Write supplied to one input end of he NOR circuit $21_{-8}$ is "L (Low)". Further, the data inversion control signal Dinv from the data scramble circuit 51 is "L", and supplied to one input end of the exclusive OR circuit $21_{-6}$. An output WDIN of the input receiver 13 is supplied to the other input end of the exclusive OR circuit $21_{-6}$. Thereby, data having the same phase as that of the out WDIN is supplied from the exclusive OR circuit $21_{-6}$ to the other input end of the NAND circuit $21_{-7}$ and the other input end of the NOR circuit $21_{-8}$.

Specifically, the output of the exclusive OR circuit $21_{-6}$ is supplied to the other input end of the NAND circuit $21_{-7}$ for controlling the gate of the PMOS transistor $21_{-9}$. Further, the output of the exclusive OR circuit $21_{-6}$ is supplied to the other input end of the NOR circuit $21_{-8}$ for controlling the gate of the NMOS transistor $21_{-10}$. As a result, data (data of the RWD line 23) having the same phase as that of the output WDIN is outputted from an intermediate node (junction point) between the PMOS transistor $21_{-9}$ and the NMOS transistor $21_{-10}$, which are connected in series between a power supply node VINT and a ground node VSS.

In the meantime, if data inversion is performed in write operation, the data inversion control signal Dinv from the data scramble circuit 51 is "H". Thereby, the output of the exclusive OR circuit $21_{-6}$ has the phase opposite to that of the output WDIN of the input receiver 13. Specifically, the exclusive OR circuit $21_{-6}$ outputs data having the phase opposite to that of the output WDIN. As a result, data (data of the RWD line 23) having the phase opposite to that of the data of the output WDIN is outputted from the intermediate node (junction point) between the PMOS transistor $21_{-9}$ and the NMOS transistor $21_{-10}$.

As described above, the multiplexer 21, specifically, the read multiplexer 21A enables data inversion control in read operation, that is, inversion of the direction (phase) of the data read from a cell in read operation. Further, the write multiplexer 21B enables data inversion control in write operation, that is, inversion of direction (phase) of data to be written in a cell in write operation.

Figure 14:
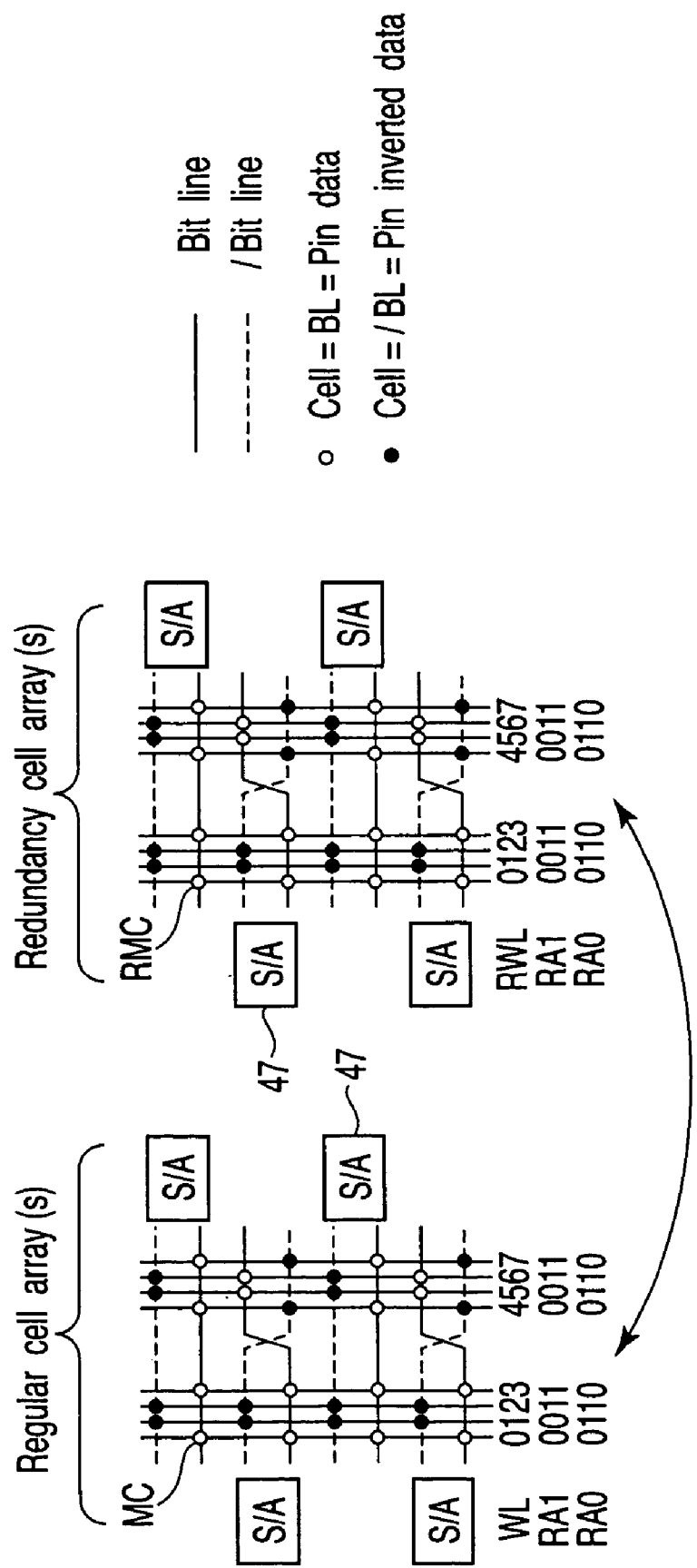
FIG. 14 is a diagram for explanation of the effect produced if data inversion control is performed.

Next, the effect obtained by the above data inversion control is explained. In this example, explained is the case where word lines WL0, 1, 2 and 3 of a memory (regular) cell array in a bit line twist system are replaced by word lines RWL 4, 5, 6 and 7 of a redundancy cell array, as shown in FIG. 14. In this example, "one-twist system" is adopted.

Figure 15A:
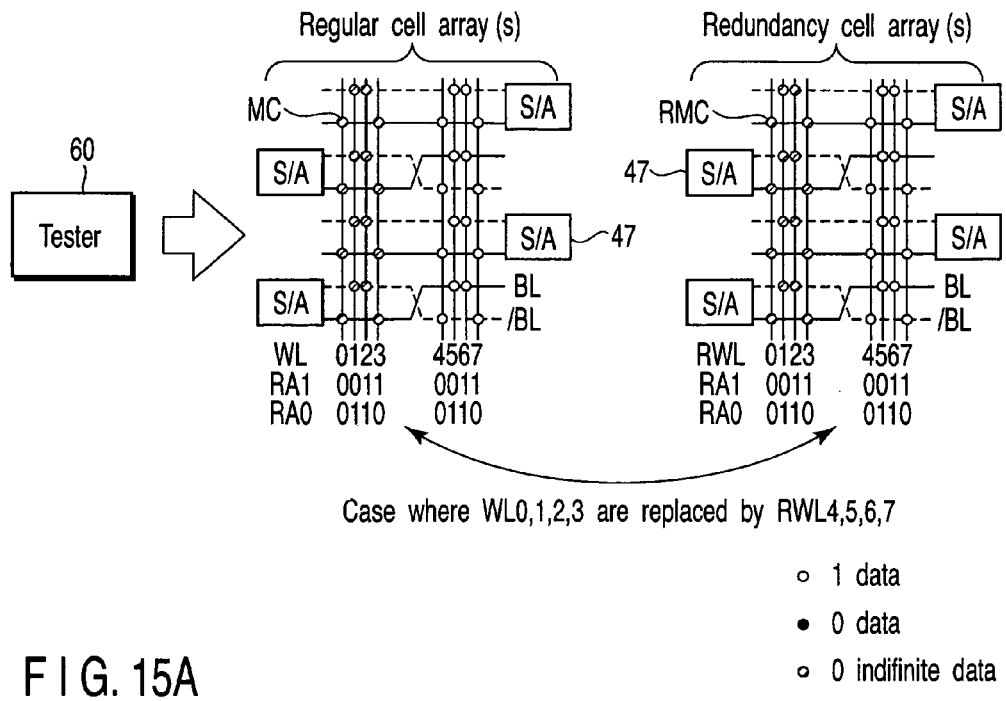
FIGS. 15A and 15B are diagrams illustrating, in comparison with prior art, an operation example in the case where data "1" is written in all the cells.
Figure 15B:
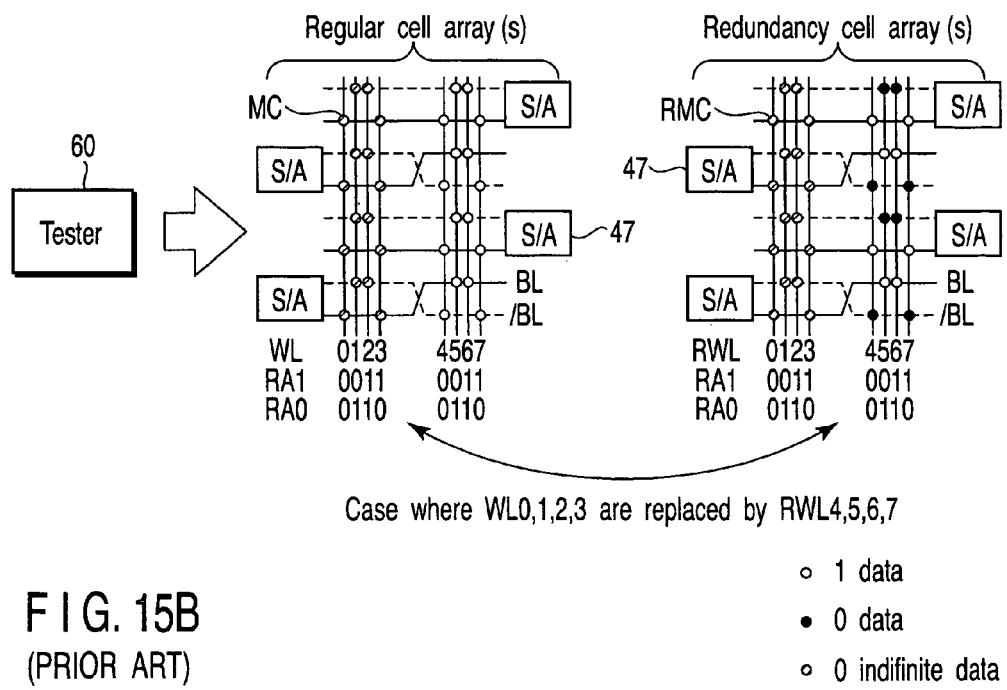

FIGS. 15A and 15B illustrate examples of the case where data "1" is written in all the cells by using a tester. FIG. 15A illustrates an operation example according to this embodiment of the present invention, and FIG. 15B denotes operation of prior art.

As shown in FIG. 15B, in prior art, data "1" can be correctly written in each of regular cells connected to word lines WL0 to WL7 of a regular cell array by an external tester 60. Further, also in the case where the word lines WL0 to WL3 of the regular cell array are replaced by, for example, word lines RWL0 to RWL3 of the redundancy cell array, data "1" can be correctly written in each of the cells connected to the word lines RWL0 to RWL3. However, data "0", not data "1", is written in some of the cells connected to the word lines RWL4 to RWL7 which have replaced the word lines. After redundancy replacement, data of the redundancy cells which have replaced cannot be controlled from the outside. Therefore, a desired test cannot be performed in the subsequent memory test. According to circumstances, there may be cases where proper evaluation cannot be performed, for example, a defective cell cannot be found.

In comparison with this, if data "1" can be written in all the cells from an external tester 60 by data inversion control by using the data scramble circuit 51 as shown in FIG. 15A., it is possible to write data having the same phase as that of regular cells before replacement can be written in redundancy cells. Therefore, a desired test can be performed in the subsequent memory test, and the redundancy cells which have replaced the regular cells can be properly evaluated.

Figure 16:
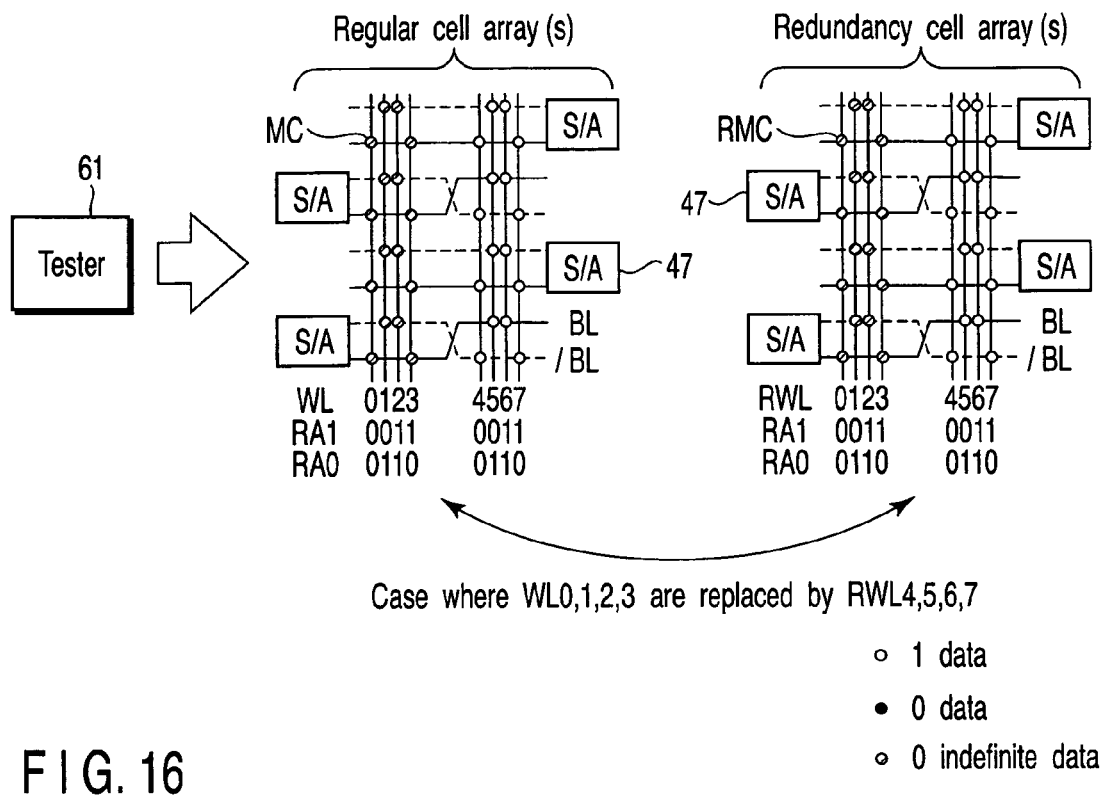
FIG. 16 is a diagram illustrating another operation example in the case where data "1" is written in all the cells.

FIG. 16 illustrates another example of operation in the case where data "1" is written in all the cells by using a tester. In this example, explained is the case where a tester 61 containing a data scramble program, which has already been used in a semiconductor memory device (memory chip) adopting a bit line straight system, is used in the memory test.

As described above, if data inversion control by the data scramble circuit 51 can be performed, it becomes possible to use the tester 61 having the data scramble program for bit lines adopting the straight system in the memory test or the like. In this case, it is possible to not only write data having the same phase as that of the regular cells before replacement in redundancy cells, but also use the conventional data scramble program with no change.

Figure 17:
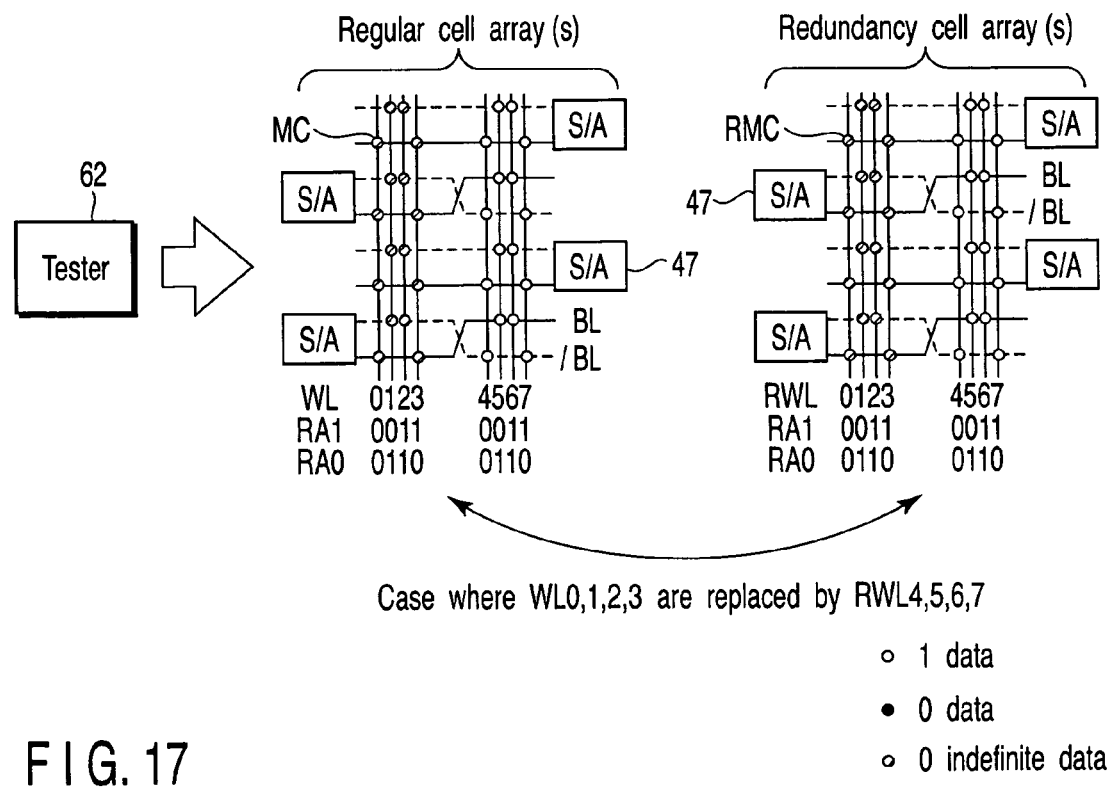
FIG. 17 is a diagram illustrating further another operation example in the case where data "1" is written into all the cells.

FIG. 17 illustrate further another example of operation in the case where data "1" is written in all the cells by using a tester. In this example, explained is the case where the data scramble circuit on the tester is omitted.

As described above, if data inversion control by the data scramble circuit 51 is performed, data scramble (data inversion control) is performed inside the memory chip 10 such that the pin data of a tester 62 is constantly the same as the cell data. Thereby, it is possible to write data "1" in all the cells from the external tester 62, without using a data scramble circuit.

In all the above cases, it is possible to ensure the data of all the cells from the external tester, even after redundancy replacement.

In the above explanations, for the sake of convenience, "one-time twist system" in which only alternate bit line pairs are twisted is used as examples. The embodiments of the present invention are not limited to it, but the present invention is applicable to semiconductor memory devices adopting various bit line twist systems, such as the twist system disclosed in Jpn. Pat. Appln. KOKAI Pub. No. 62-51096.

Figure 18:
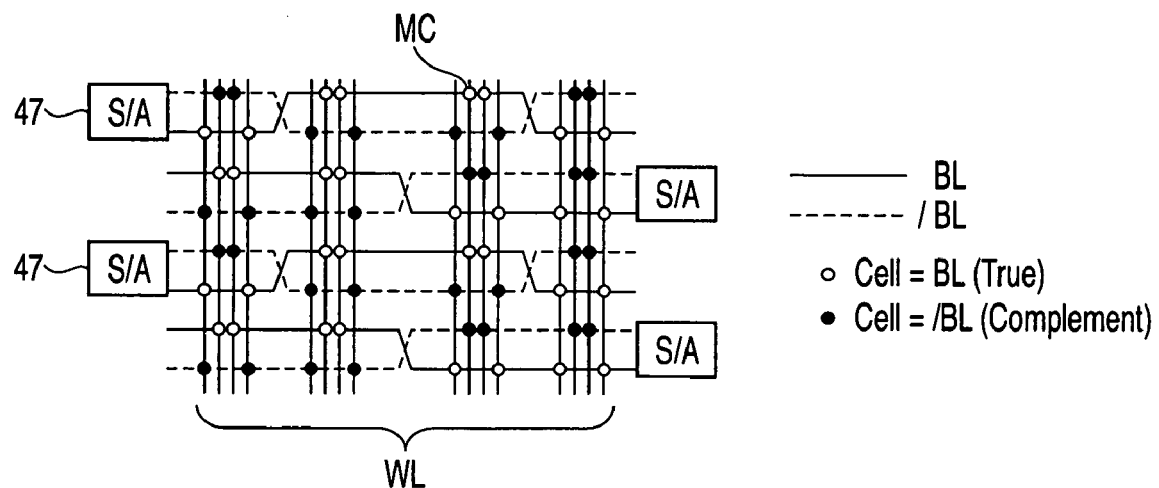
FIG. 18 is a diagram illustrating arrangement of cells with an example of True-Complement-Complement-True (tcct) type.
Figure 19:
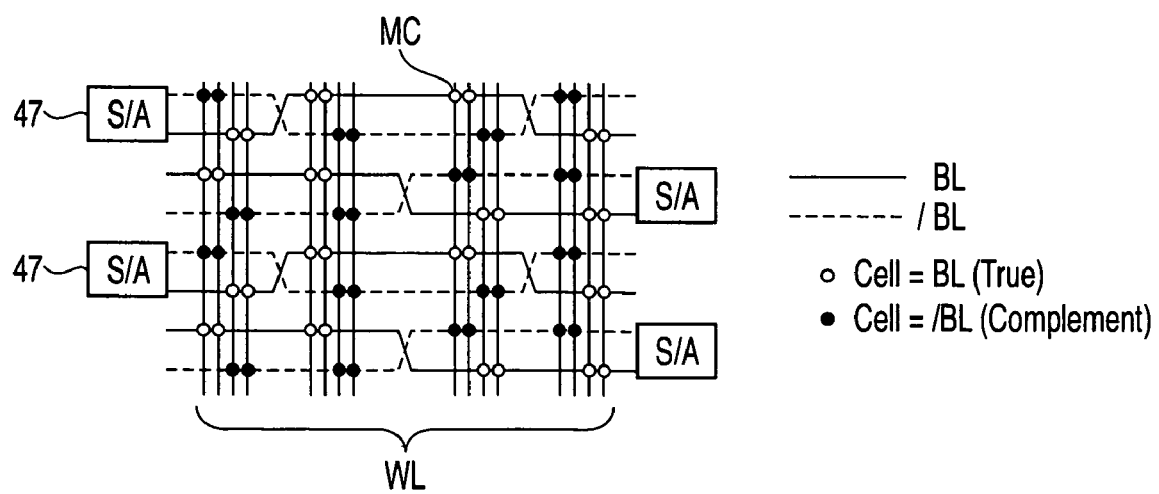
FIG. 19 is a diagram illustrating arrangement of cells with an example of True-True-Complement-Complement (ttcc) type.

Further, in the above embodiments, the semiconductor memory device is not limited to, for example, True-Complement-Complement-True (tcct) type, as shown in FIG. 18, but may be a semiconductor memory device of True-True-Complement-Complement (ttcc) type, as shown in FIG. 19. The present invention is applicable to various semiconductor memory devices, regardless of arrangements of cells.

Figures 20, 21:
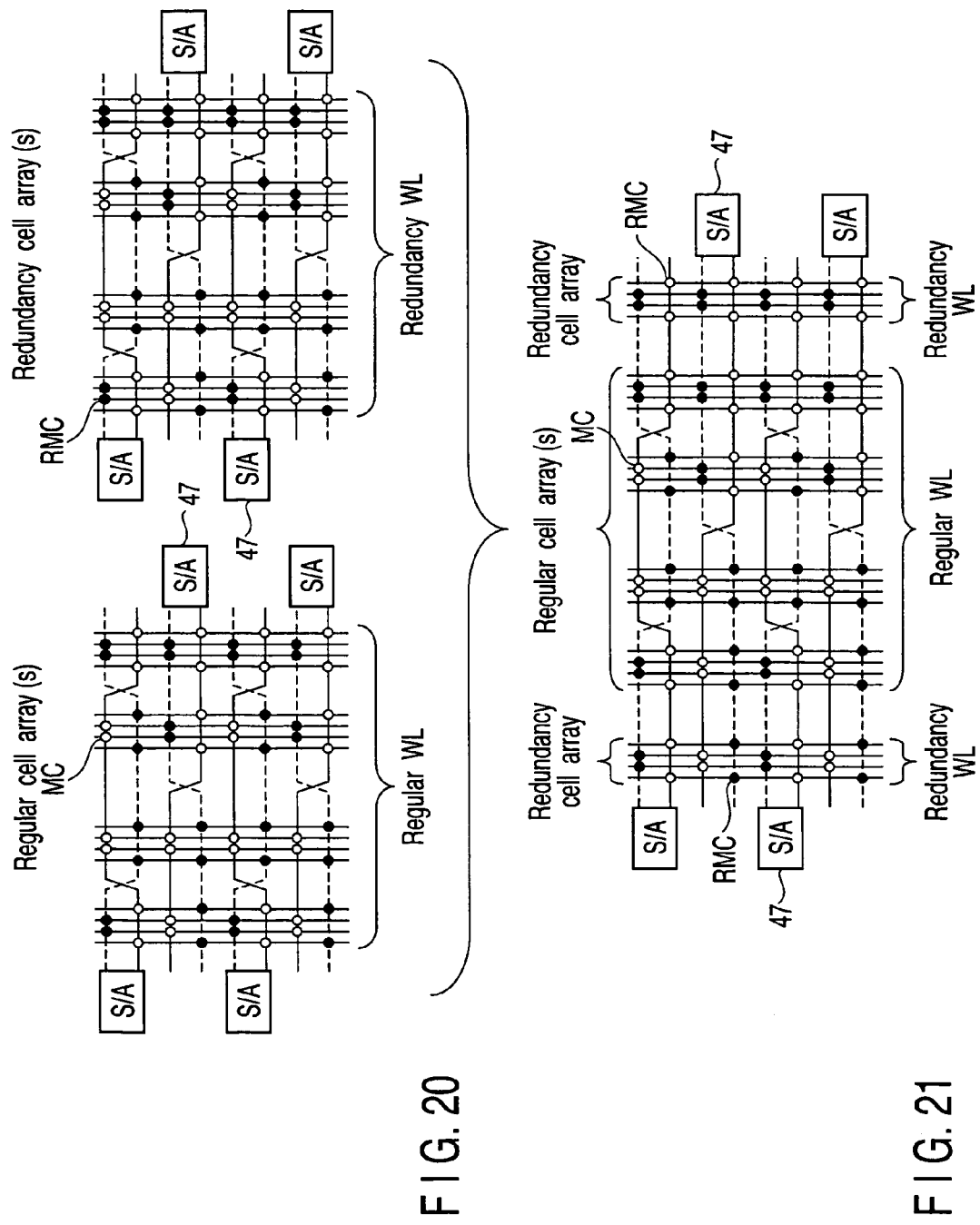
FIG. 20 is a diagram of configuration of a cell array portion, illustrating a concentrated arrangement type in which a plurality of redundancy cell arrays are concentratedly arranged in one place.
FIG. 21 is a diagram of configuration of the cell array portion, illustrating a distributed arrangement type in which a plurality of redundancy cell arrays are distributively arranged.

Furthermore, in the above embodiments, the semiconductor memory is not limited to a concentrated arrangement type in which a plurality of redundancy cell arrays are concentrated in one place, as shown in FIG. 20. For example, the present invention is also applicable to semiconductor memory devices of a distributed arrangement type, in which a plurality of redundancy cell arrays are distributed as shown in FIG. 21.

Additional advantages and modifications will readily occur to those skilled in the art. Therefore, the invention in its broader aspects is not limited to the specific details and representative embodiment shown and described herein. Accordingly, various modifications may be made without departing from the spirit or scope of the general inventive concept as defined by the appended claims and their equivalents.

What is claimed is:

1. A semiconductor memory device adopting a bit line twist system in which at least a part of bit lines are twisted, comprising:

memory cell arrays each having a plurality of memory cells to store data;

redundancy cell arrays each having a plurality of redundancy cells to replace a defective cell in the memory cell array;

a control circuit which performs control to invert a direction of the data; and an inversion circuit which inverts the direction of the data, in accordance with the control by the control circuit.

2. A semiconductor memory device according to claim 1, wherein the control circuit controls the inversion circuit according to an access to the redundancy cell which has replaced the defective cell.

3. A semiconductor memory device according to claim 1, wherein the inversion circuit conforms a direction of data to be written in the redundancy cell which has replaced the defective cell, to a direction of data which was being written in the defective cell in writing.

4. A semiconductor memory device according to claim 1, wherein in reading the inversion circuit inverts the direction of the data read from the redundancy cell which has replaced the defective cell.

5. A semiconductor memory device according to claim 4, wherein the inversion circuit at least includes:

a transfer gate which is turned on in response to supply of a data inversion control signal from the control circuit;

a NAND circuit to which data of a first data line is supplied through the transfer gate;

a PMOS transistor having a gate which is controlled by an output of the NAND circuit;

a NOR circuit to which data of a second data line complementary to the first data line is supplied through the transfer gate; and an NMOS transistor having a gate which is controlled by an output of the NOR circuit, and the inversion circuit outputs the data from the second data line to the outside in reading.

6. A semiconductor memory device according to claim 4, wherein the inversion circuit at least includes:
a first exclusive OR circuit which outputs data having the same phase as that of data of a first data line, in response to supply of a data inversion control signal from the control circuit;
a NAND circuit to which an output of the first exclusive OR circuit is supplied;
a PMOS transistor having a gate which is controlled by an output of the NAND circuit;
a second exclusive OR circuit which outputs data having the same phase as that of data of a second data line complementary to the first data line, in response to supply of the data inversion control signal from the control circuit;
a NOR circuit to which an output of the second exclusive OR circuit is supplied; and
an NMOS transistor having a gate which is controlled by an output of the NOR circuit,
and the inversion circuit outputs the data from the second data line to the outside in reading.

7. A semiconductor memory device according to claim 4, wherein the inversion circuit at least includes:
a clocked inverter circuit which outputs data having the same phase as that of data of a first data line, in response to supply of a data inversion control signal from the control circuit;
a NAND circuit to which an output of the clocked inverter circuit is supplied;
a PMOS transistor having a gate which is controlled by an output of the NAND circuit;
a transfer gate which outputs data having the same phase as that of data of a second data line complementary to the first data line, in response to supply of the data inversion control signal from the control circuit;
a NOR circuit to which an output of the transfer gate is supplied; and
an NMOS transistor having a gate which is controlled by an output of the NOR circuit,
and the inversion circuit outputs the data from the second data line to the outside in reading.

8. A semiconductor memory device according to claim 4, wherein the inversion circuit at least includes:
a conversion circuit which generates an operation control signal on the basis of a data inversion control signal from the control circuit;
a NAND circuit which operates in accordance with the operation control signal from the conversion circuit, the NAND circuit being supplied with data having the same phase as that of data of a first data line;
a PMOS transistor having a gate which is controlled by an output of the NAND circuit;
a NOR circuit which operates in accordance with the operation control signal from the conversion circuit, the NOR circuit being supplied with data having the same phase as that of data of a second data line complementary to the first data line, through an inverter circuit, and
an NMOS transistor having a gate which is controlled by an output of the NOR circuit,
and the inversion circuit outputs the data from the second data line to the outside in reading.

9. A semiconductor memory device according to claim 4, wherein the inversion circuit at least includes:
a conversion circuit which generates an operation control signal on the basis of a data inversion control signal from the control circuit;
a switch circuit which is controlled in accordance with the operation control signal from the conversion circuit, the switch circuit switching between a first connection, in which a first main data line is connected to a first local data line and a second main data line is connected to a second local data line, and a second connection, in which the first main data line is connected to the second local data line and the second main data line is connected to the first local data line, the second main data line being complementary to the first main data line, the second local data line being complementary to the first local data line; and
a first bit line connected to the first local data line and a second bit line connected to the second local data line, the second bit line being complementary to the first bit line,
in writing, the inversion circuit outputs data having a phase opposite to that of the data to be written to the first bit line, and data having the same phase as that of the data to be written to the second bit line.

10. A semiconductor memory device according to claim 1, wherein the inversion circuit inverts a direction of data to be written in the redundancy cell which has replaced the defective cell in writing.

11. A semiconductor memory device according to claim 10, wherein the inversion circuit at least includes:
an exclusive OR circuit which outputs data having a phase opposite to that of data to be actually written, in response to supply of a data inversion control signal from the control circuit;
a first NOR circuit to which an output of the exclusive OR circuit is supplied through a first inverter circuit;
a first NMOS transistor having a gate which is controlled by an output of the first NOR circuit;
a first NAND circuit to which the output of the excusive OR circuit is supplied through the first inverter circuit;
a first PMOS transistor having a gate which is controlled by an output of the first NAND circuit;
a second NAND circuit to which the output of the exclusive OR circuit is supplied through the first inverter circuit and a second inverter circuit;
a second PMOS transistor having a gate which is controlled by an output of the second NAND circuit;
a second NOR circuit to which the output of the exclusive OR circuit is supplied through the first inverter circuit and the second inverter circuit; and
a second NMOS transistor having a gate which is controlled by an output of the second NOR circuit,
in writing, the inversion circuit outputs data having a phase opposite to that of the data to be written to a first data line, and data having the same phase as that of the data to be written to a second data line complementary to the first data line.

12. A semiconductor memory device according to claim 10, wherein the inversion circuit at least includes:
a transfer gate which outputs data having a phase opposite to that of data to be actually written, in response to supply of a data inversion control signal from the control circuit;
a first NOR circuit to which an output of the transfer gate is supplied;
a first NMOS transistor having a gate which is controlled by an output of the first NOR circuit;
a first NAND circuit to which the output of the transfer gate is supplied;

a first PMOS transistor having a gate which is controlled by an output of the first NAND circuit;

a second NAND circuit to which the output of the transfer gate is supplied through an inverter circuit;

a second PMOS transistor having a gate which is controlled by an output of the second NAND circuit;

a second NOR circuit to which the output of the transfer gate is supplied through the inverter circuit; and a second NMOS transistor having a gate which is controlled by an output of the second NOR circuit, in writing, the inversion circuit outputs data having a phase opposite to that of the data to be written to a first data line, and data having the same phase as that of the data to be written to a second data line complementary to the first data line.

13. A semiconductor memory device according to claim 10, wherein the inversion circuit at least includes:

a conversion circuit which generates an operation control signal on the basis of a data inversion control signal from the control circuit;

a switch circuit which is controlled in accordance with the operation control signal from the conversion circuit, the switch circuit switching between a first connection, in which a first main data line is connected to a first local data line and a second main data line is connected to a second local data line, and a second connection, in which the first main data line is connected to the second local data line and the second main data line is connected to the first local data line, the second main data line being complementary to the first main data line, the second local data line being complementary to the first local data line; and a first bit line connected to the first local data line and a second bit line connected to the second local data line, the second bit line being complementary to the first bit line, in writing, the inversion circuit outputs data having a phase opposite to that of the data to be written to the first bit line, and data having the same phase as that of the data to be written to the second bit line.

14. A semiconductor memory device according to claim 1, wherein the inversion circuit inverts a direction of data read from the redundancy cell which has replaced the defective cell in reading, and inverts a direction of data to be written in the redundancy cell which has replaced the defective cell in writing.

15. A semiconductor memory device according to claim 14, wherein the inversion circuit includes:

a first circuit at least including:
　a first exclusive OR circuit which outputs data having a phase opposite to that of data read onto a data input/output line, in response to supply of a data inversion control signal from the control circuit;
　a first NOR circuit to which an output of the first exclusive OR circuit is supplied;
　a first NMOS transistor having a gate which is controlled by an output of the first NOR circuit;
　a first NAND circuit to which the output of the first excusive OR circuit is supplied; and
　a first PMOS transistor having a gate which is controlled by an output of the first NAND circuit,
　the first circuit being configured to output data having a phase opposite to that of the data read onto the data input/output line is outputted to the outside in reading; and a second circuit at least including:
　a second exclusive OR circuit which outputs data having a phase opposite to that of data to be actually written, in response to supply of the data inversion control signal from the control circuit;
　a second NOR circuit to which an output of the second exclusive OR circuit is supplied;
　a second NMOS transistor having a gate which is controlled by an output of the second NOR circuit,
　a second NAND circuit to which the output of the second exclusive OR circuit is supplied; and
　a second PMOS transistor having a gate which is controlled by an output of the second NAND circuit,
　the second circuit being configured to output data having a phase opposite to that of the data to be actually written is outputted to the data input/output line in writing.

16. A semiconductor memory device according to claim 1, having a True-Complement-Complement-True structure.

17. A semiconductor memory device according to claim 1, having a True-True-Complement-Complement structure.

18. A semiconductor memory device according to claim 1, having a concentrated arrangement structure in which the redundancy cell arrays are concentrated in one place.

19. A semiconductor memory device according to claim 1, having a distributed arrangement structure in which the redundancy cell arrays are distributed.

* * * * *